(12) United States Patent
Shibasaki et al.

(10) Patent No.: US 8,154,280 B2
(45) Date of Patent: Apr. 10, 2012

(54) THIN FILM LAMINATION, THIN FILM MAGNETIC SENSOR USING THE THIN FILM LAMINATION AND METHOD FOR MANUFACTURING THE THIN FILM LAMINATION

(75) Inventors: Ichiro Shibasaki, Tokyo (JP); Hirotaka Geka, Tokyo (JP); Atsushi Okamoto, Tokyo (JP)

(73) Assignee: Asahi Kasei Kabushiki Kaisha, Osaka (JP)

( * ) Notice: Subject to any disclaimer, the term of this patent is extended or adjusted under 35 U.S.C. 154(b) by 398 days.

(21) Appl. No.: 12/516,538

(22) PCT Filed: Nov. 29, 2007

(86) PCT No.: PCT/JP2007/073058
§ 371 (c)(1),
(2), (4) Date: May 27, 2009

(87) PCT Pub. No.: WO2008/066118
PCT Pub. Date: Jun. 5, 2008

(65) Prior Publication Data
US 2010/0045282 A1    Feb. 25, 2010

(30) Foreign Application Priority Data
Nov. 30, 2006 (JP) ................... 2006-324573

(51) Int. Cl.
*G01R 33/02* (2006.01)
*H01L 31/107* (2006.01)

(52) U.S. Cl. ........................ 324/249; 257/186

(58) Field of Classification Search .............. 324/249; 257/186
See application file for complete search history.

(56) References Cited

U.S. PATENT DOCUMENTS

| 5,453,727 | A | 9/1995 | Shibasaki et al. |
| 7,633,083 | B2 * | 12/2009 | Lester et al. .............. 257/20 |
| 7,768,048 | B2 * | 8/2010 | Ueno et al. .............. 257/293 |

FOREIGN PATENT DOCUMENTS

| EP | 1 124 271 A1 | 8/2001 |
| JP | 6-77556 A | 3/1994 |

(Continued)

OTHER PUBLICATIONS

Okamoto et al., "Transport properties of InSb and InAs thin films on GaAs substrates", Journal of Crystal Growth 278, 2005, pp. 604-609.

(Continued)

*Primary Examiner* — Bot Ledynh
(74) *Attorney, Agent, or Firm* — Birch, Stewart, Kolasch & Birch, LLP

(57) ABSTRACT

Relating to a thin film lamination and a thin film magnetic sensor using the thin film lamination and a method for manufacturing the thin film lamination that realizes a thin film conducting layer having high electron mobility and sheet resistance as an InAsSb operating layer. A thin film lamination is provided which is characterized by having an $Al_xIn_{1-x}Sb$ mixed crystal layer formed on a substrate, and an $InAs_xSb_{1-x}$ ($0<x\leq1$) thin film conducting layer directly formed on the $Al_xIn_{1-x}Sb$ layer, in which the $Al_xIn_{1-x}Sb$ mixed crystal layer is a layer that exhibits higher resistance than the $InAs_xSb_{1-x}$ thin film conducting layer or exhibits insulation or p-type conductivity, and its band gap is greater than the $InAs_xSb_{1-x}$ thin film conducting layer, and the a lattice mismatch is +1.3% to −0.8%.

19 Claims, 12 Drawing Sheets

FOREIGN PATENT DOCUMENTS

| | | |
|---|---|---|
| JP | 10-233539 A | 9/1998 |
| JP | 2000-138403 A | 5/2000 |
| JP | 2003-318459 A | 11/2003 |

OTHER PUBLICATIONS

European Search Report 07832773.1 dated Dec. 29, 2011.
Kudo et al., "Increased electron mobility of InAsSb channel heterostructures grown on GaAs substances by molecular beam epitaxy", Journal of Vacuum Science & Technology B, vol. 18, No. 2, Mar./Apr. 2000, pp. 746-750.
Kudo et al., "High electron mobility AlInSb/InAsSb heterostuctures grown on GaSa substrates by molecular beam epitaxy", Inst. Phys. Con.Ser. No. 162: Chapter 10, Oct. 12-16, 1998, pp. 505-510.
Kudo et al., "Improved Electron Mobility of AlInSb/InAsSb/AlInSb Heterostructures Grown Lattice/Mismatched on GaAs Substrates", Japanese Journal of Applied Physics, Part 2, vol. 37, No. 10A, Oct. 1, 1998, pp. L1132-L1132.

* cited by examiner

THIN FILM LAMINATION, THIN FILM MAGNETIC SENSOR USING THE THIN FILM LAMINATION AND METHOD FOR MANUFACTURING THE THIN FILM LAMINATION

TECHNICAL FIELD

The present invention relates to a thin film lamination, a thin film magnetic sensor using the thin film lamination and a method for manufacturing the thin film lamination, and particularly to a thin film lamination, a thin film magnetic sensor using the thin film lamination and a method for manufacturing the thin film lamination applicable to semiconductor thin film magnetic sensors and the like.

BACKGROUND ART

An InSb single crystal thin film grown by a conventional MBE method has large electron mobility and is suitable as a material of Hall elements or magneto-resistance elements. For example, it is reported that a 1.0 μm thick InSb thin film formed on a semiconductor GaAs substrate by doping a proper quantity of Sn has small temperature dependence of resistance and exhibits very high electron mobility, and hence it is a material capable of realizing highly sensitive magnetic sensors such as magneto-resistance elements or Hall elements operating in a wide temperature range (see Non-Patent Document 1). In addition, an InAs thin film is also a magnetic sensor material suitable for Hall elements and the like just as the InSb thin film (see Patent Document 1).

However, as for future magnetic sensor applications such as Hall elements, magnetic sensors are required to have higher sensitivity, lower power consumption and smaller temperature dependence, and thin film magnetic sensor materials are required to have higher electron mobility, higher sheet resistance and smaller temperature dependence. In addition, to meet such future magnetic sensor fabrication, thin film magnetic sensor materials are necessary, which have smaller temperature dependence of the resistance and electron mobility, and have higher electron mobility. Considering from such a point of view, it is essential to fabricate InSb thin films whose thickness is very thin and temperature dependence is small. However, when actually fabricating a InSb single crystal thin film on a GaAs substrate, for example, it is found that because of a large difference between their lattice constants, the electron mobility reduces drastically with the reduction in the film thickness in a range where the thickness of the InSb is less than 0.5 μm. As a result, fabrication of highly sensitive magnetic sensor is very difficult. Besides, there is another problem of marked characteristic deterioration in a practical magnetic sensor manufacturing process.

According to Non-Patent Document 1, it is generally known that when InSb is epitaxially grown on a GaAs substrate having a lattice mismatch, it has a three-layer structure that has layers with small electron mobility near its heteroepitaxial interface with the GaAs substrate and near its surface, and has the midsection with high electron mobility. It is considered that the low electron mobility layers are formed because of the lattice mismatch. As for the formation of the low electron mobility layer near the InSb surface, considering the surface of the InSb thin film as a heteroepitaxial interface with the vacuum (it can be considered a heteroepitaxial interface in a sense that it has not a party crystal lattice), it is understandable that it is formed because of the mismatch between the vacuum (atmosphere) and InSb.

Since a range (thickness) where the mismatch has an effect is considered to be nearly constant, the layers with small electron mobility near the heteroepitaxial interface with the GaAs substrate and near the surface have fixed thicknesses independently of the thickness of the InSb in its entirety, respectively.

Thus, the reduction in the electron mobility with the reduction in the thickness of the InSb occurs because of the reduction of the region (unaffected by the mismatch) with high electron mobility in the midsection involved in the reduction of the film thickness. Accordingly, it is expected that minimizing the regions affected by the mismatch can minimize the reduction in the electron mobility in spite of thinning the film. In other words, it is expected that eliminating the lattice mismatch of the heteroepitaxial interfaces formed on and under the operating layer can probably reduce or extinguish the thickness of the low electron mobility layers formed in adjacent to the heteroepitaxial interfaces.

FIG. 5 is a diagram showing relationships between the lattice constant (nm) and band gap energy (eV) of compound semiconductors for explaining the lattice mismatch in an InSb quantum well structure. As shown in FIG. 5, as for InSb, there is no insulating substrate material that makes lattice matching and has a large band gap. In addition, a narrow band gap material such as InSb has an essential, very important problem in that although it has large electron mobility, its resistance and electron mobility has great temperature dependence. Accordingly, when devices such as magnetic sensors are fabricated, they have large differences in resistance across driving terminals (referred to as "input resistance") between a high temperature and a low temperature. Consequently, although it is comparatively easy to drive the elements around room temperature, as for recent applications which use them below −20° C. or up to a high temperature not less than 100° C., since the resistance value reduces with the temperature, the driving current increases with the temperature. Thus, it is necessary to protect the elements from damages due to over current, which imposes great restrictions on driving conditions, and presents a historically well-known problem in that the element driving becomes very difficult.

Furthermore, the large electron mobility will reduce the sheet resistance of the operating layer. When the film thickness of the operating layer is reduced to curb the reduction of the sheet resistance, the electron mobility reduces drastically because the low electron mobility layers are formed owing to the lattice mismatch in the substrate and surfaces as described above. Since the thicknesses of the low electron mobility layers do not change even if the film thickness of the operating layer is reduced, only the thickness of the high electron mobility layer reduces as a matter of course. Accordingly, the electron mobility reduces with the reduction of the film thickness, and the formation of the operating layer for fabricating the highly sensitive magnetic sensor becomes impossible.

In addition, according to experiments of the inventors of the present invention, it is well known that when the thickness of the operating layer is 0.5 μm or less in a single layer, and when an inorganic insulating protective film such as a protective film of $SiO_2$ or $Si_3N_4$ is formed on the operating layer in the manufacturing process of fabricating the magnetic sensor, damage to the operating layer because of the protective film, which is referred to as process variation, can occur. In the case where the operating layer consists of InSb, although the damage is only about 10% when its thickness is 1.0 μm, the reduction of the electron mobility will reach 50% or more when it is 0.5 μm. Furthermore, the film thickness of 0.2 μm brings about the electron mobility reduction of 70% or more. It presents a more serious problem than the layer with the low electron mobility, which results from the exposure of the surface of the operating layer to a vacuum or air, and becomes a cause of hampering the fabrication of a practical highly sensitive magnetic sensor.

Such surface damage to the operating layer occurring at the protective film formation takes place because of collision of atoms or molecules, which come flying at the protective film formation and constitute the protective film, with the surface of the operating layer with kinetic energy as well as because of the lattice mismatch between the protective film and the operating layer or the difference in the crystal structure between the protective film and the operating layer, and presents a very serious problem yet to be solved. In addition, the damage reduces the reliability of the elements markedly, and increases variations of the characteristics of the elements fabricated. Furthermore, there is a very serious problem of being unable to use the thin film of the operating layer for fabricating practical highly sensitive magnetic sensors. It becomes a very difficult problem when trying to fabricate highly reliable practical magnetic sensors.

Conventionally, here is a reason why highly sensitive practical magnetic sensors cannot be fabricated by making effective use of the electron mobility in InSb-based thin films.

A thin film lamination has been required which has an operating layer suitable for highly sensitive magnetic sensor fabrication, which is able to produce, without the damage in the process, the magnetic sensors that are highly sensitive, have little temperature dependence, can be driven in a broad temperature range, and are superior in reliability such as high driving stability, that is, and that the operating layer of the magnetic sensors that have high sheet resistance, have high electron mobility, are free from the damage in the element manufacturing process, and have very small dependence of the sheet resistance or electron mobility on the temperature. However, the technologies up to now do not implement such thin film lamination.

In particular, it is very difficult to fabricate highly sensitive, low power consumption, very small temperature dependence thin film magnetic sensors such as Hall elements which have a narrow band gap thin film operating layer of 0.2 μm or less in thickness containing In and Sb, and they have not yet been realized.

In particular, when fabricating the Hall elements or magneto-resistance elements, the target is to reduce their power consumption and to increase their magnetic field detection sensitivity simultaneously, and further to zero the thickness of the low electron mobility layers, which are formed on the upper and lower sides of the operating layer of the magnetic sensor, or to keep the thickness very thin equivalent to zero, and simultaneously to minimize the temperature dependence of the operating layer including In and Sb.

The present invention is implemented to solve the foregoing problems. Therefore it is an object of the present invention to provide a thin film lamination having an InAsSb-based operating layer, and a thin film magnetic sensor using the thin film lamination and a method for manufacturing the thin film lamination.

More specifically, the present invention aims to provide a thin film laminated material having a thin operating layer (thin film conducting layer) with high electron mobility, which is suitable for fabricating devices such as InAsSb-based magnetic sensors even if the operating layer is 1 μm or less in film thickness by extremely reducing the thickness of the low electron mobility layers caused by the effect of the lattice mismatch formed at the upper and lower sides of the operating layer. Furthermore, it aims, in such an element as described in Non-Patent Document 1, to provide a thin film with large electron mobility by securing a portion with high electron mobility in the midsection by extremely thinning or zeroing the low electron mobility layers of the operating layer, which exist near the interface making contact with the substrate and near the surface. Besides, it aims to fabricate a magnetic sensor employing as its operating layer a thin film with high electron mobility and high sheet resistance.

In addition, it aims to realize a guard structure of the operating layer that can prevent damage when forming the protective film in the fabrication process of the practical magnetic sensor, and to realize the operating layer with small temperature dependence.

Patent Document 1: Japanese Patent Laid-Open No. H6-77556 (1994).

Non-Patent Document 1: "Transport properties of Sn-doped InSb thin films on GaAs substrates" (Journal of Crystal Growth, Vol. 278 (2005), pp. 604-609)

DISCLOSURE OF THE INVENTION

The inventors of the present invention comprehensively and intensively investigated by experiment the conditions for stacking an AlInSb thin film and then an InAsSb single crystal thin film on a GaAs substrate with a molecular beam epitaxial method, the composition ratios and insulation of individual component elements, electron transport characteristics of the resultant InAsSb layer and the like. As a result, we found that when the Al composition was about 9% or more, a sheet resistance of 10 kΩ (ohm) or more was obtained when the thickness of the AlInSb layer was 0.7 μm. In addition, we found that if a lattice mismatch between AlInSb exhibiting insulation and the InAsSb conducting layer was +1.3% to −0.6% or less (preferably within 0.5%, further preferably within ±0.2% or the best 0%), a thin film with high electron mobility was able to be obtained, thereby achieving the present invention.

More specifically, a thin film lamination in accordance with the present invention has an $Al_xIn_{1-x}Sb$ mixed crystal layer ($0.08 \leq x \leq 1$) formed on a substrate; and an $InAs_xSb_{1-x}$ ($0 < x \leq 1$) thin film conducting layer formed directly on the $Al_xIn_{1-x}Sb$ mixed crystal layer, wherein the $Al_xIn_{1-x}Sb$ mixed crystal layer is a layer that exhibits higher resistance than the $InAs_xSb_{1-x}$ thin film conducting layer or that exhibits insulation or p-type conductivity, and by having a band gap greater than the $InAs_xSb_{1-x}$ thin film conducting layer and by having a lattice mismatch of +1.3% to −0.8%.

The $Al_xIn_{1-x}Sb$ mixed crystal layer is characterized by having percentage (x) of content of Al atoms of 8% to 30% ($0.08 \leq x \leq 0.3$).

A thin film lamination in accordance with the present invention has an $Al_xGa_yIn_{1-x-y}Sb$ mixed crystal layer ($0 < x+y \leq 1, x \neq 0$) formed on a substrate; and an $InAs_xSb_{1-x}$ ($0 < x \leq 1$) thin film conducting layer directly formed on the $Al_xGa_yIn_{1-x-y}Sb$ mixed crystal layer, wherein the $Al_xGa_yIn_{1-x-y}Sb$ mixed crystal layer is a layer that exhibits higher resistance than the $InAs_xSb_{1-x}$ thin film conducting layer or that exhibits insulation or p-type conductivity, and by having a band gap greater than the $InAs_xSb_{1-x}$ thin film conducting layer and by having a lattice mismatch of +1.3% to −0.8% with the $InAs_xSb_{1-x}$ thin film conducting layer.

The $Al_xGa_yIn_{1-x-y}Sb$ mixed crystal layer is having percentage (x+y) of content of Al and Ga atoms of 8.0%-30% ($0.08 \leq x+y \leq 0.3$).

The $InAs_xSb_{1-x}$ thin film conducting layer is doped with at least one of Te, S, Se, Sn, Si and Ge, which belong to VI group atoms or IV group atoms as donor impurities.

The full width at half maximum of X-ray diffraction of the $Al_xIn_{1-x}Sb$ mixed crystal layer or of the $Al_xGa_yIn_{1-x-y}Sb$ mixed crystal layer is 50 seconds to 1,000 seconds.

A lattice mismatch between the $Al_xIn_{1-x}Sb$ mixed crystal layer or the $Al_xGa_yIn_{1-x-y}Sb$ mixed crystal layer and the $InAs_xSb_{1-x}$ thin film conducting layer is +1.3% to −0.8%.

A lattice mismatch between the $Al_xIn_{1-x}Sb$ mixed crystal layer or the $Al_xGa_yIn_{1-x-y}Sb$ mixed crystal layer and the $InAs_xSb_{1-x}$ thin film conducting layer is ±0.2% or less.

The $InAs_xSb_{1-x}$ ($0<x\leqq1$) thin film conducting layer is having a film thickness of 100 nm or less and 10 nm or more and electron mobility of 30,000 $cm^2/Vs$ or more.

It is characterized by that the substrate is a GaAs substrate; the $Al_xIn_{1-x}Sb$ mixed crystal layer is an $Al_{0.1}In_{0.9}Sb$ mixed crystal layer; and the $InAs_xSb_{1-x}$, thin film conducting layer is an $InAs_{0.09}Sb_{0.91}$ thin film conducting layer.

It has an $Al_xIn_{1-x}Sb$ mixed crystal layer ($0.08\leqq x\leqq1$) or an $Al_xGa_yIn_{1-x-y}Sb$ mixed crystal layer ($0<x+y<1, x\neq0$) directly formed on the $InAs_xSb_{1-x}$ ($0<x\leqq1$) thin film conducting layer as a cap layer, wherein the $Al_xIn_{1-x}Sb$ mixed crystal cap layer or the $Al_xGa_yIn_{1-x-y}Sb$ mixed crystal cap layer is a layer that exhibits higher resistance than the $InAs_xSb_{1-x}$ thin film conducting layer or that exhibits insulation or p-type conductivity, and by having a band gap greater than the $InAs_xSb_{1-x}$ thin film conducting layer, and by having a lattice mismatch of +1.3% to −0.8% with the $InAs_xSb_{1-x}$ thin film conducting layer.

It is characterized by that the substrate is a GaAs substrate; the $Al_xIn_{1-x}Sb$ mixed crystal layer is an $Al_{0.1}In_{0.9}Sb$ mixed crystal layer; the $InAs_xSb_{1-x}$ thin film conducting layer is an $InAs_{0.09}Sb_{0.91}$ thin film conducting layer; and the $Al_xIn_{1-x}Sb$ mixed crystal layer of the cap layer is an $Al_{0.1}In_{0.9}Sb$ mixed crystal layer, and further including a GaAs protective film on the cap layer of the $Al_{0.1}In_{0.9}Sb$ mixed crystal layer as a cap layer.

It is characterized by that a GaAs insulating layer is formed on the substrate; the AlInSb mixed crystal layer is formed thereon; the InAsSb conducting layer is formed next; an AlInSb layer is further formed on the InAsSb conducting layer as a cap layer; and an insulating thin GaAs cap layer is further formed on the AlInSb cap layer.

A thin film magnetic sensor in accordance with the present invention employs the $InAs_xSb_{1-x}$ thin film conducting layer of one of the foregoing thin film laminated bodies as its operating layer.

The thin film conducting layer of one of the foregoing thin film laminated bodies is characterized by being an operating layer of an element utilizing Hall effect or of an element utilizing magnetic resistance effect.

It is characterized by that the thin film magnetic sensor and a Si integrated circuit chip for amplifying a sensor signal of the thin film magnetic sensor are electrically connected, and are put into a single package.

A manufacturing method of a thin film lamination in accordance with the present invention is a manufacturing method of a thin film lamination using a molecular beam epitaxy system having a crystal growth chamber capable of maintaining a ultra-high vacuum, a component for heating and evaporating Al, In, Sb and As, or Al, In, Sb, As and Ga in the crystal growth chamber by controlling their vapor pressure independently, a component for heating and evaporating at least one of S, Se, Sn, Si, Ge and Te as donor impurity sources by controlling their vapor pressure independently, a component for holding a crystal growth plane of a substrate at a level substantially, and a component for carrying the substrate in or out of the crystal growth chamber, and comprises at least the step of: growing an insulating AlInSb mixed crystal layer on the substrate by exposing the substrate plane heated at 300 to 500° C. to vapors of necessary component elements in a condition in which a degree of background vacuum is maintained at $1\times10^{-10}$ to $1\times10^{-6}$ Pa (pascal); and forming an InAsSb thin film conducting layer on the AlInSb mixed crystal layer by epitaxial growth of InAsSb with a lattice mismatch of +1.3% to −0.8% with the AlInSb mixed crystal layer.

It is characterized by including at least the step of: forming the InAsSb with a lattice mismatch of +1.3% to −0.8% with the AlInSb mixed crystal layer on the AlInSb mixed crystal layer by epitaxial growth; and forming and stacking an AlInSb mixed crystal layer with a lattice mismatch of +1.3% to −0.8% with the InAsSb mixed crystal layer on the InAsSb next.

It is characterized by that the substrate is a GaAs substrate, and by including the step of: growing the $Al_{0.1}In_{0.9}Sb$ mixed crystal layer by 0.7 μm on the GaAs substrate, growing the $InAs_{0.09}Sb_{0.91}$ thin film conducting layer by 0.15 μm thereon; growing the $Al_{0.09}In_{0.91}Sb$ mixed crystal layer by 0.05 μm as a cap layer; and further forming a 0.0065 μm thick GaAs cap layer as a protective film of a top layer.

A manufacturing method of a thin film magnetic sensor in accordance with the present invention is a manufacturing method of a thin film magnetic sensor using a molecular beam epitaxy system having a crystal growth chamber capable of maintaining a ultra-high vacuum, a component for heating and evaporating Al, In, Sb and As, or Al, In, Sb, As and Ga in the crystal growth chamber by controlling their vapor pressure independently, a component for heating and evaporating at least one of S, Se, Sn, Si, Ge and Te as donor impurity sources by controlling their vapor pressure independently, a component for holding a crystal growth plane of a substrate at a level substantially, and a component for carrying the substrate in or out of the crystal growth chamber, and characterized by including at least the step of: growing an insulating AlInSb mixed crystal layer on the substrate by exposing the substrate plane heated at 300 to 500° C. to vapors of necessary component elements in a condition in which a degree of background vacuum is maintained at $1\times10^{-10}$ to $1\times10^{-6}$ Pa (pascal); forming an InAsSb thin film conducting layer on the AlInSb mixed crystal layer by epitaxial growth of InAsSb with a lattice mismatch of +1.3% to −0.8% with the AlInSb mixed crystal layer; processing the formed InAsSb thin film conducting layer into a necessary magnetic sensor pattern; forming a plurality of magnetic sensor chips on a wafer simultaneously by forming ohmic electrode metals in the patterned InAsSb thin film conducting layer; and fabricating individual magnetic sensor chips by cutting off with a dicing saw.

A manufacturing method of a thin film magnetic sensor in accordance with the present invention is a manufacturing method of a thin film magnetic sensor using a molecular beam epitaxy system having a crystal growth chamber capable of maintaining a ultra-high vacuum, a component for heating and evaporating Al, In, Sb, As and Ga in the crystal growth chamber by controlling their vapor pressure independently, a component for heating and evaporating Sn, Si and Te as donor impurity sources by controlling their vapor pressure independently, a component for holding a crystal growth plane of a substrate at a level substantially, and a component for carrying the substrate in or out of the crystal growth chamber, and characterized by including at least the step of: growing an insulating AlInSb mixed crystal layer on the substrate by exposing the substrate plane heated at 300 to 500° C. to vapors of necessary component elements in a condition in which a degree of background vacuum is maintained at $1\times10^{-10}$ to $1\times10^{-6}$ Pa (pascal); forming an InAsSb thin film conducting layer on the AlInSb mixed crystal layer by epitaxial growth of InAsSb with a lattice mismatch of +1.3% to −0.8% with the AlInSb mixed crystal layer; forming on the InAsSb thin film conducting layer an AlInSb mixed crystal layer constituting a cap layer with a lattice mismatch of +1.3% to −0.8% with the InAsSb conducting layer and forming a GaAs insulating layer next; a step of processing the formed InAsSb thin film conducting layer into a necessary magnetic sensor pattern; forming a plurality of magnetic sensor chips on a wafer simultaneously by forming ohmic electrode metals in a manner as to make ohmic contact with the patterned InAsSb thin film conducting layer; and fabricating individual magnetic sensor chips by cutting off with a dicing saw.

According to the present invention, the thin film lamination in accordance with the present invention can provide the operating layer having the high electron mobility and high sheet resistance even if its thickness is extremely thin, thereby being able to fabricate and offer a highly sensitive practical InAsSb thin film magnetic sensor which is impossible by conventional techniques. In addition, its temperature dependence is reduced by doping donor impurities, and it exhibits very high temperature stability in the magnetic sensor fabrication. Thus, usefulness of the present invention is very large.

BEST MODE FOR CARRYING OUT THE INVENTION

The best mode for carrying out the invention will now be described with reference to the accompanying drawings.

Example 1

Figure 1A:
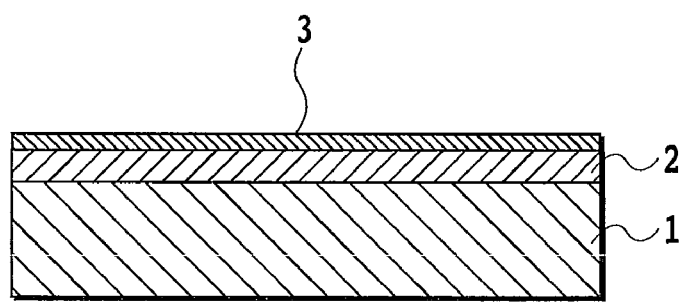
FIG. 1A is a sectional view of a structural view showing an InAsSb thin film lamination in accordance with the present invention.
Figure 1B:
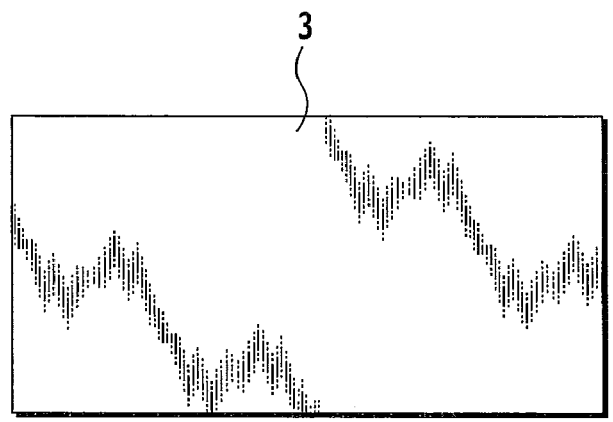
FIG. 1B is a top view of the structural view showing the InAsSb thin film lamination in accordance with the present invention.

FIG. 1A and FIG. 1B are views showing a sectional structure of a thin film lamination in accordance with the present invention, a structural view showing an InAsSb thin film lamination in accordance with the present invention: FIG. 1A is a sectional view; and FIG. 1B is its top view. In these figures, the reference numeral 1 designates a substrate, 2 designates an $Al_xGa_yIn_{1-x-y}Sb$ mixed crystal layer (buffer layer) ($0<x+y\leq1$, $x\neq0$) constituting an insulating layer, and 3 designates an $InAs_xSb_{1-x}$ ($0<x\leq1$) thin film conducting layer constituting an operating layer. FIG. 1B shows a state in which the $InAs_xSb_{1-x}$ ($0<x\leq1$) thin film conducting layer constituting the operating layer appears at the top surface.

In the thin film lamination in accordance with the present invention, the $Al_xGa_yIn_{1-x-y}Sb$ mixed crystal layer ($0<x+y\leq1$, $x\neq0$) 2 whose lattice constant is equal or close to that of the $InAs_xSb_{1-x}$ thin film conducting layer is formed on the substrate 1, and the $InAs_xSb_{1-x}$ thin film conducting layer 3 is formed directly on the $Al_xGa_yIn_{1-x-y}Sb$ mixed crystal layer as the operating layer. By forming such an insulating $Al_xGa_yIn_{1-x-y}Sb$ mixed crystal layer ($0<x+y<1$, $x\neq 0$) 2 between the substrate 1 and the operating layer 3 in contact with the operating layer 3, the lattice mismatch is lessened and the effect on its electron mobility is reduced. Although the thin film lamination in accordance with the present invention with such a structure is applied to devices such as magnetic sensors, it further aims to improve the characteristics and reliability as well.

Example 2

Figure 2A:
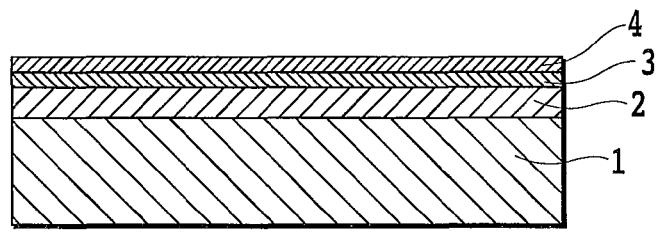
FIG. 2A is a sectional view of a structural view of a thin film lamination with a structure having an InAsSb thin film conducting layer constituting the operating layer sandwiched between AlInSb mixed crystal layers at its top and bottom.
Figure 2B:
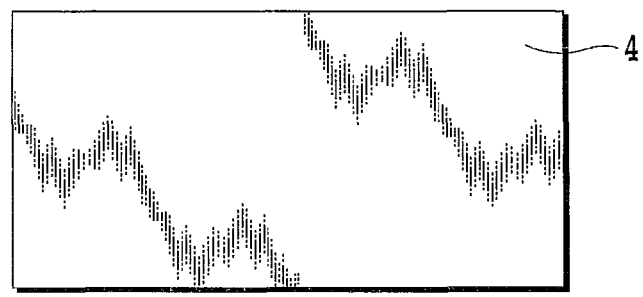
FIG. 2B is a top view of the structural view of the thin film lamination with the structure having the InAsSb thin film conducting layer constituting the operating layer sandwiched between the AlInSb mixed crystal layers at its top and bottom.
Figure 2C:
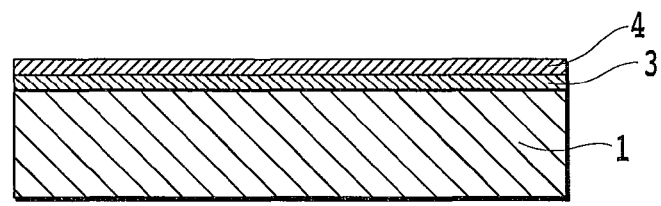
FIG. 2C is a sectional view of a structural view of a thin film lamination with a structure having an AlInSb mixed crystal layer formed on an InAsSb thin film conducting layer constituting the operating layer formed on a substrate.
Figure 2D:
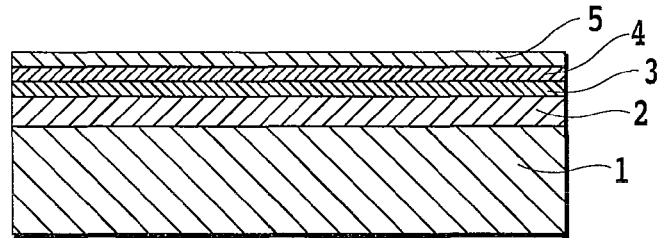
FIG. 2D is a sectional view of a structural view of a thin film lamination with a structure having an InAsSb thin film conducting layer constituting the operating layer sandwiched between AlInSb mixed crystal layers at its top and bottom, and having a GaAs cap layer formed on the top surface.

FIG. 2A to FIG. 2D are structural views of a thin film lamination in accordance with the present invention with a structure having an InAsSb thin film conducting layer constituting the operating layer sandwiched between an AlInSb mixed crystal layer 2 and an AlInSb mixed crystal layer 4 constituting a cap layer at its top and bottom: FIG. 2A is a sectional view; FIG. 2B is its top view; FIG. 2C is a sectional view of the thin film lamination when the InAsSb layer 3 constituting the operating layer is formed directly on a substrate 1, and the AlInSb mixed crystal layer 4 constituting an insulating layer of a cap layer is formed thereon; and FIG. 2D is a sectional view when a GaAs insulating protective layer 5 is formed.

The reference numeral 4 in FIG. 2A designates an AlInSb mixed crystal layer appearing on the top surface. A reason for assuming such a stacked structure is that since the electron mobility in the operating layer can be reduced because of a low electron mobility layer existing in the surface of the $InAs_xSb_{1-x}$ thin film conducting layer which is a heteroepitaxial interface just as the heteroepitaxial interface with the substrate, the insulating AlInSb mixed crystal layer 4 is sometimes stacked directly on the operating layer as a cap layer in order to reduce the effect of the layer with small electron mobility in the interface with a vacuum or to prevent the characteristic deterioration in the operating layer during the process, which belongs to the technical scope of a thin film lamination in accordance with the present invention.

To be more specific, the insulating AlInSb mixed crystal layer 4 of the cap layer is also formed because of the following reasons, which is important.

More specifically, when applying a thin film lamination in accordance with the present invention to the operating layer of a magnetic sensor, the magnetic sensor such as a Hall element or magneto-resistance element fabricated can sometimes have a surface protective layer formed in order to provide reliability or durability. The insulating layer formed for protecting the surface of the element, which is generally carried out, can be an inorganic film such as $Si_3N_4$ or $SiO_2$, or an organic film such as a polyimide or silicone resin, or a lamination of the two.

However, when the InAsSb layer is thin, such as 1.0 μm or less, or 0.5 μm or less, or further 0.2 μm or less, the lattice mismatch with the protective layer or the plasma particles which collide against the InAsSb thin film surface in a process such as a plasma CVD used for forming a protective layer extremely deteriorates the characteristics of the operating layer such electron mobility. For example, the value can sometimes reach even 50% at 0.5 μm thickness and exceeds 70% at 0.2 μm. As for film thickness thinner than that, more serious characteristic deterioration can occur.

Accordingly, it sometimes occurs that a magnetic sensor with desired characteristics cannot be fabricated, and this presents a great problem. To prevent such cases, the AlInSb mixed crystal layer 4, which is composed of III-V semiconductors and is a semiconductor insulating layer whose lattice constant is equal or close to that of InAsSb, is formed on the InAsSb layer as a cap layer. Thus, the insulating layer of the cap layer is essential and is formed in order to reduce the lattice mismatch with the protective layer of $SiO_2$ or the like, or to reduce the effect of the plasma impact at the time when forming the protective layer.

FIG. 2C shows a cross sectional view of the thin film lamination when the operating layer InAsSb layer 3 is formed directly on the substrate 1, and the AlInSb mixed crystal layer 4 constituting the insulating layer of the cap layer is formed thereon. In this case, only the thickness of the low electron mobility layer in the top surface of the operating layer is reduced. In addition, FIG. 2D shows a sectional view when a GaAs insulating protective layer 5 is formed on the top surface as a cap layer.

Next, as the substrate of the thin film lamination in accordance with the present invention, although a GaAs single crystal is generally used, a Si single crystal substrate, a Si single crystal substrate whose surface undergoes insulating processing or a Si single crystal substrate whose surface has an insulating GaAs layer formed thereon is widely used.

According to the present invention, the thin film lamination has a structure having the InAsSb thin film conducting layer 3 sandwiched between the AlInSb mixed crystal layer 2 formed on the substrate 1 and the AlInSb mixed crystal layer 4 of the cap layer as described above. Furthermore, the chemically and physically stable insulating GaAs protective layer 5 is sometimes formed thereon. When fabricating a magnetic sensor, a thin film of an inorganic insulating layer such as $Si_3N_4$ or $SiO_2$ or a thin film or thin layer of an organic polyimide is sometimes formed on the stacked structure as needed as a passivation layer for the purpose of passivation.

Since the cap layer 4 and the GaAs protective layer 5 formed as a second cap layer are electrically inactive, they have no influence on the characteristics of the magnetic sensor element even if the collision of the plasma particles or the lattice mismatch with the passivation thin film occurs or some damage takes place in the magnetic sensor manufacturing process. As a result, even if the thickness of the InAsSb is 1 μm or less, when fabricating the magnetic sensor using the lamination in accordance with the present invention, there is an advantage of being able to reduce the characteristic deterioration due to the process to approximately zero. Thus, the thin film lamination in accordance with the present invention makes it possible to fabricate a highly sensitive magnetic sensor because the InAsSb operating layer with the high electron mobility obtained by forming the AlInSb mixed crystal layer (also called "buffer layer") 2 suffers very little degradation in its characteristics such as electron mobility in the operating layer in the fabrication process of the magnetic sensor because of the foregoing AlInSb or GaAs compound semiconductor protective layer formed on the operating layer as the cap layer.

As for the thin film lamination in accordance with the present invention, it is basically enough that on the substrate is formed a stacked structure which is a combination of the foregoing InAsSb operating layer 3 with the insulating layer 2 constituting the buffer layer, or a combination of the InAsSb operating layer 3 with the insulating layer 4 constituting the cap layer, or a combination of the insulating layer 2 constituting the buffer layer with the operating layer 3 and the insulating layer 4 constituting the cap layer. Like the GaAs layer 5 formed on the surface, a thin layer other than the foregoing thin layers can be stacked on the lamination.

As for the lattice matching between the $InAs_xSb_{1-x}$ thin film conducting layer 3 and the AlInSb mixed crystal layer 2 thereunder in the thin film lamination in accordance with the present invention, although a range from +1.3% to −0.8% is practically acceptable, a range within ±0.5% is preferable for fabricating a highly sensitive element. A range within ±0.2% is particularly preferable, and ±0.0 is best.

In addition, as for the sheet resistance of the AlInSb mixed crystal layer, 10 kΩ (ohm) or more is necessary. As for the thickness of the mixed crystal layer, although there are not any particular restrictions, insulation is important because the object is to fabricate a magnetic sensor, and its upper limit is normally determined by the sheet resistance. The value x+y that determines the insulation of the mixed crystal layer is normally 0.09 or more. In addition, although the lattice mismatch between the InAsSb operating layer and the AlInSb mixed crystal layer of the cap layer is from +1.3% to −0.8%, it is preferably about 0.5% or less on the positive side. As for the Al composition x of the cap layer, it is preferably 0.09 or more because of its good insulation.

Example 3

Figure 3A:
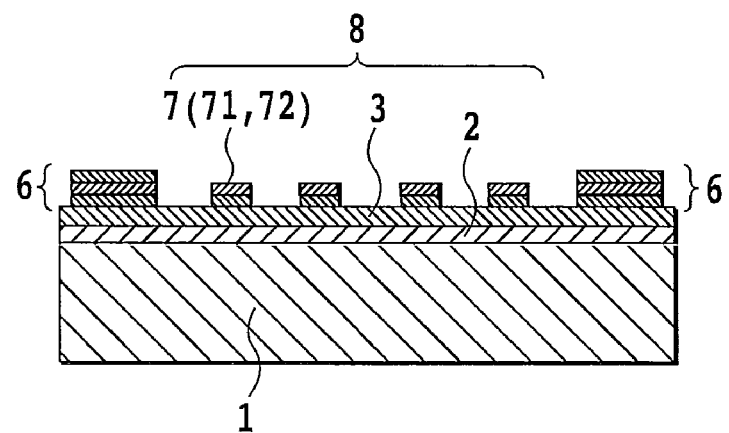
FIG. 3A is a sectional view showing an example of a magneto-resistance element using a thin film lamination in accordance with the present invention.
Figure 3B:
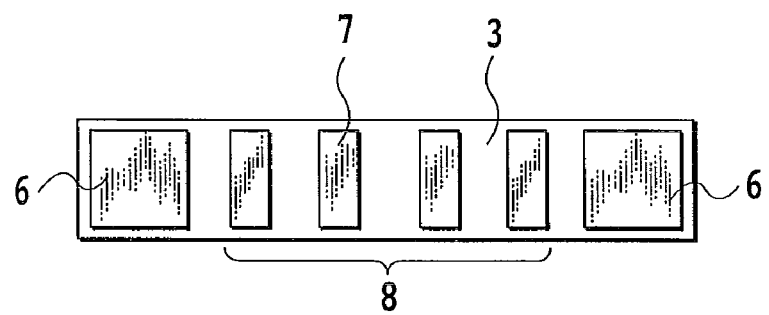
FIG. 3B is a top view showing the example of the magneto-resistance element using the thin film lamination in accordance with the present invention.

FIG. 3A and FIG. 3B are sectional views showing an example of a magneto-resistance element using a thin film lamination in accordance with the present invention. In FIG. 3A, the reference numeral 6 designates terminal electrodes for connecting the magneto-resistance element to the outside. The example has 3-layer metal thin film electrodes formed on the InAsSb operating layer 3 in ohmic contact. In addition, the reference numeral 7 designates 2-layer metal electrodes which are inserted between the terminal electrodes and are formed on the InAsSb thin film operating layer in ohmic contact. The electrodes 7, which are also called short-circuit electrodes or short-bar electrodes, are formed plurally between the terminal electrodes, and are used to improve the sensitivity of the magnetic resistance effect. FIG. 3B is a top view of the magneto-resistance element. The portion designated by the reference numeral 8 is a sensor section for detecting magnetism of the magneto-resistance element.

Example 4

Figure 4A:
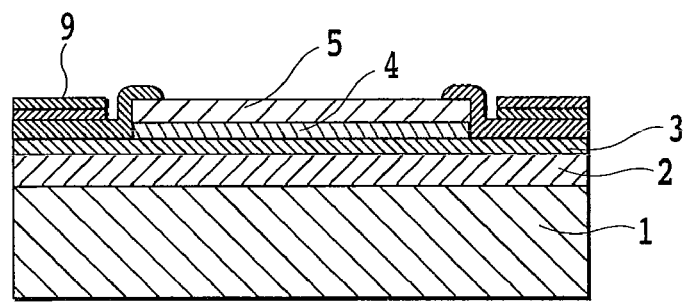
FIG. 4A is a sectional view showing an example of a Hall element using a thin film lamination in accordance with the present invention with a structure having an InAsSb thin film conducting layer constituting the operating layer sandwiched between an AlInSb mixed crystal layer and an AlInSb mixed crystal layer constituting a cap layer at its top and bottom.
Figure 4B:
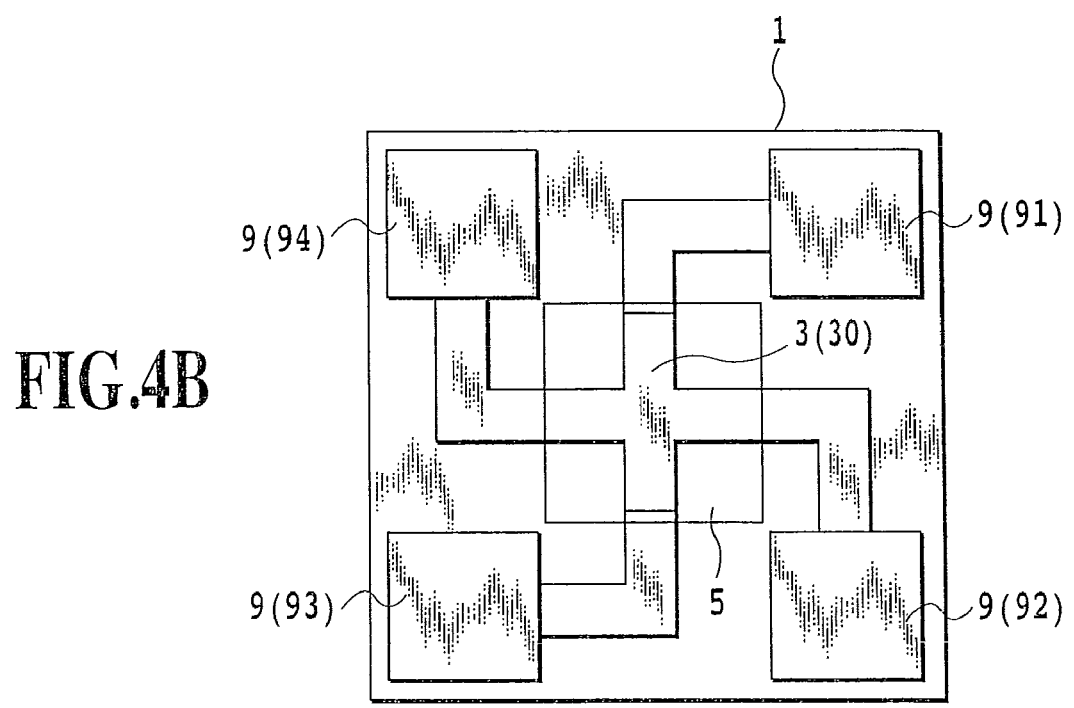
FIG. 4B is a top view showing the example of the Hall element using the thin film lamination in accordance with the present invention with the structure having the InAsSb thin film conducting layer constituting the operating layer sandwiched between the AlInSb mixed crystal layer and the AlInSb mixed crystal layer constituting the cap layer at its top and bottom.
Figure 5:
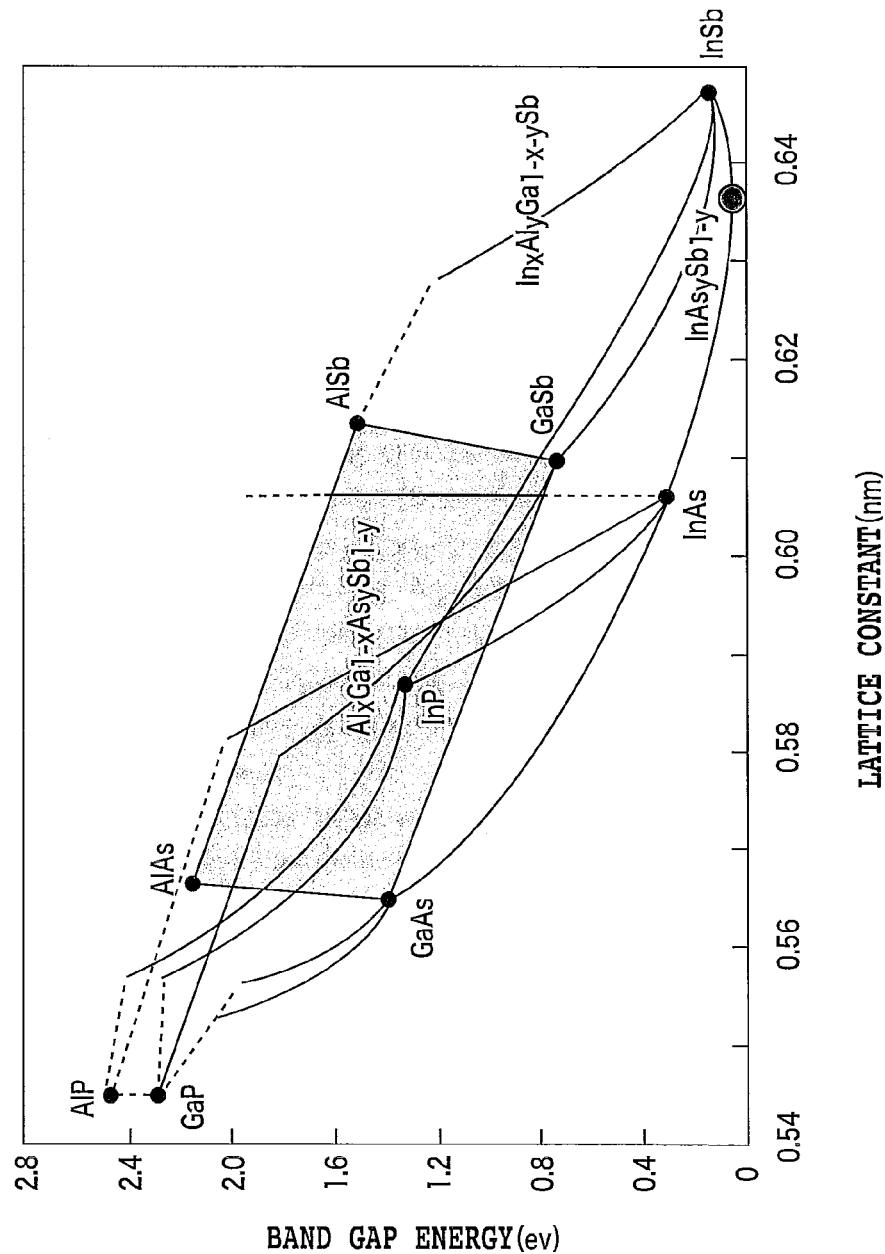
FIG. 5 is a diagram showing relationships between lattice constants (nm) and band gap energy (eV) of compound semiconductors.

FIG. 4A and FIG. 4B are views showing an example of a Hall element using a thin film lamination in accordance with the present invention with a structure having an InAsSb thin film conducting layer sandwiched between an AlInSb mixed crystal layer 2 and an AlInSb mixed crystal layer 4 of a cap layer at its top and bottom. In FIG. 4A, the reference numeral 9 designates terminal electrodes (normally formed in 3-layers) for connecting the Hall element to the outside, which make ohmic contact with the InAsSb of the operating layer. On the top surface, a protective layer 5 composed of an insulating GaAs thin film is formed as a cap layer. FIG. 4B is a top view of the Hall element, in which the reference numeral 9 (91, 92, 93 and 94) designates 3-layer terminal electrodes, and the reference numeral 5 designates a GaAs insulating layer (protective film). The portion 3 (30) designates the InAsSb of the operating layer for forming a pattern of the Hall element. The insulating GaAs layer 5 at the top is a semiconductor insulating layer formed as needed, and the insulating layer (protective film) 5 is formed for the purpose of preventing the deterioration in the thin film of the sensor section composed of InAsSb in the fabrication process. Although it is possible to use a material which has high insulation such as insulating GaAs and has about the same band gap as AlGaInSb or more, GaAs is a most commonly used example.

In the foregoing example, as for the lattice matching between the $InAs_xSb_{1-x}$ thin film conducting layer 3 and the insulating layer 2 of the AlInSb mixed crystal layer at the lower part, and between it and the insulating layer 4 of the AlInSb mixed crystal layer at the upper part, although a range from +1.3% to −0.8% is practically acceptable, a range within +0.5% is preferable to fabricate a highly sensitive magnetic sensor element. A range within 10.2% is particularly preferable, and ±0.0 is best. It does not matter whether the compositions of the upper and lower AlInSb mixed crystal layers agree or not.

In addition, as for the sheet resistances of the AlInSb mixed crystal layers 2 and 4 which are formed on and under the $InAs_xSb_{1-x}$ thin film conducting layer, 10 kΩ (ohm) or more is necessary for each of them. As for the thickness of the layers, although there are not any particular restrictions, insulation is important because the object is to fabricate a magnetic sensor, and its upper limit is normally determined by the sheet resistance. The value x+y that determines the insulation of the layers is normally 0.09 or more.

In the following, a description will be made by way of example of fabricating the $InAs_xSb_{1-x}$ (0<x≦1) thin film conducting layer constituting the operating layer or magnetic sensor section of the semiconductor thin film in accordance with the present invention.

<Experimental Product of Thin Film Lamination>

As an example, results will be described of trying growing an AlInSb mixed crystal layer (buffer layer) and an AlInSb thin film whose lattice constant is close to that of InAsSb, and then of trying growing an InAsSb layer. A three-layer structure of AlInSb/InAsSb/AlInSb was experimentally fabricated and its characteristics were examined.

A molecular beam epitaxy system used is a VG-made V100 system, which has a substrate holder capable of mounting 12 pieces of 2-inch substrates at a time. The degree of vacuum of the background was $1\times10^{-8}$ Torr or less ($1\times10^{-10}$-$1\times10^{-6}$ Pa (pascal)). A growth substrate temperature was fixed at 440° C. for all the AlInSb, InSb and GaAs layers. A growth rate was set at 1 μm/hr. As for the Al composition of the AlInSb layer (the lattice constant, and the lattice mismatch between the AlInSb layer and InAsSb layer) or as for the crystalline of the AlInSb layer, they were estimated using X-ray diffraction. Electrical characteristics of the AlInSb layer and InAsSb were estimated using Hall measurement.

(a) Growth of AlInSb Mixed Crystal Layer:

Setting the substrate temperature at 440° C. and the growth rate at 1 μm/hr, 0.7 μm thick AlInSb layers with various Al composition were MBE grown directly on a GaAs substrate, first. Varying the Al composition, the lattice constant and sheet resistance of the AlInSb, and the full width at half maximum (FWHM) of the X-ray diffraction of the AlInSb were measured. As for the measurement of the lattice constant and FWHM of the AlInSb, an X-ray diffraction system employing a 4-crystal monochromator was used. The sheet resistance increases monotonically as the Al composition increases. The insulation of the AlInSb is excellent, and the sheet resistance is about 10 kΩ (ohm) when Al is 10%.

In addition, in the growth conditions, the full width at half maximum of the X-ray diffraction increases in proportion to an increase of Al. It is preferable that the full width at half maximum FWHM of the X-ray diffraction be small for later crystal growth of the InAsSb thin film. The FWHM is preferably 1,000 seconds or less if possible, and 500 seconds or less is greatly preferable.

To grow the InAsSb with high electron mobility on the AlInSb, the crystalline of the AlInSb layer must be excellent in addition to that the lattice constants are very close to each other (lattice matching). Although the definition of crystalline is very difficult, it is possible to think it as having few crystal defects or few surface asperities. Besides, the flatness of the surface must be good.

Accordingly, the surface roughness after the AlInSb growth suitable for growing the InAsSb should be small. In particular, 5 nm or less is preferable, and 1 nm or less is further preferable. The allowable tolerance is severer as the InAsSb film thickness is thinner, and is preferably 1/50 or less of the InAsSb film thickness. As for the mixed crystal layer, the percentage (x) of content of the Al atoms is 8% or more ($0.08 < x+y < 1$), and the percentage (x) of content of the Al atoms superior in crystalline is 30% or less, or preferably 20% or less, and the lattice mismatch with the InAsSb conducting layer is +1.3% to −0.6% or less, and preferably 0.5% or less. The lattice mismatch within ±0.2% or less is further preferable and 0% is best.

(b) Growth of AlGaInSb Mixed Crystal Layer:

The $Al_xGa_yIn_{1-x-y}Sb$ mixed crystal layer must be a layer that exhibits resistance higher than the InAsSb thin film conducting layer, or exhibits insulation or p-type conductivity. Accordingly, it must be a layer with a band gap greater than that of the InAsSb. As for the mixed crystal layer, the percentage of content of Al and Ga atoms (x+y=) is 8% or more ($0.08 \leq x+y \leq 1$) and the percentage of content of the Al and Ga atoms (x+y=) is 30% or less, or preferably 20% or less, and the lattice mismatch with the InAsSb conducting layer is preferably +1.3% to −0.6% or less, and more preferably ±0.5% or less.

According to the test of the inventors of the present invention, a more preferable region is a range where (x+y) is 8% or more and is less than 13%.

For example, as for a 3-element $Al_xIn_{1-x}Sb$ ($0 < x \leq 1$), when the Al composition is 10%, that is, x=0.1, and the thickness is 0.7 μm, the sheet resistance is about 10 kΩ. The value is a sufficiently high resistance value for the magnetic sensor fabrication. When setting the InAsSb composition of the operating layer at x=0.09, that is, 9%, the lattice constants agree approximately, and the lattice matching is established.

In the following experiments, a description will be made by way of example in which the AlInSb thickness is 0.7 μm and the Al composition is fixed at X=0.1, and as for the operating layer $InAs_xSb_{1-x}$ ($0 < x \leq 1$), the As composition is fixed at X=0.09, because this will provide a sheet resistance of about 10 kΩ (ohm) that can be practically considered to be an insulating layer.

Thus, an example will be described in which the buffer layer and cap layer are $Al_{0.1}In_{0.9}Sb$ mixed crystal layers, and the operating layer sandwiched between them is an $InAs_{0.09}Sb_{0.91}$ layer. A GaAs layer was formed as the top cap layer.

(c) MBE Growth of InAsSb:

As its sectional structure is shown in the foregoing FIG. 2D, on a GaAs substrate 1, a 0.7 μm thick $Al_{0.1}In_{0.9}Sb$ mixed crystal layer 2 was grown, and a 0.15 μm thick $InAs_{0.09}Sb_{0.91}$ thin film conducting layer 3 was grown thereon, followed by growing an $Al_{0.1}In_{0.9}Sb$ mixed crystal layer 4 as a 0.05 μm thick cap layer, and a 0.0065 μm thick GaAs insulating layer as a protective layer 5 constituting the cap layer. The AlInSb cap layer has an advantage of reducing or eliminating the low electron mobility layer by reducing the mismatch of the InAsSb surface, and further has a role of preventing, when constructing a device such as a Hall element together with the GaAs protective layer 5 constituting the cap layer as well, the idle characteristic deterioration, the so-called process variation, which is caused by a $Si_3N_4$ insulating layer formed on the surface of the element as a passivation layer.

For comparison purposes, other examples will be shown.

The electron mobility in a 0.15 μm thick InSb single crystal thin film which was directly grown on the GaAs (100) substrate with the lattice mismatch of 14% was 7500 cm²/Vs. Next, an example in accordance with the present invention, which reduces or zeros the lattice mismatch will be described. More specifically, when an $InAs_{0.09}Sb_{0.91}$ thin film conducting layer was formed after forming a 0.7 μm thick $Al_{0.1}In_{0.9}Sb$ mixed crystal layer on a GaAs substrate, since the lattice mismatch between the lower part $Al_{0.1}In_{0.9}Sb$ mixed crystal layer and the $InAs_{0.09}Sb_{0.91}$ operating layer was zero, very great electron mobility of 38,000 cm²/Vs was obtained. The difference is about 5 times. The sheet resistance of the InAsSb operating layer in this case is 170Ω (ohm), which is a sufficiently great value for the fabrication of a magnetic sensor such as a Hall element. It is conceivable that the effect of reducing the lattice mismatch results in maximizing the high InAsSb electron mobility in the operating layer.

In addition to the improvement of the electron mobility by eliminating such a mismatch, a test result of the process variation in the element manufacturing process, that is, the effect of the cap layer, will be further described using the foregoing example. In the foregoing example in accordance with the present invention, which forms the 0.15 μm thick $InAs_{0.09}Sb_{0.91}$ thin film conducting layer, further forms the 0.05 μm thick $Al_{0.1}In_{0.9}Sb$ mixed crystal layer thereon as the cap layer, and then forms the 0.006 μm thick GaAs cap layer as the protective layer, the process variation in the standard element manufacturing process is 5% or less. Thus, it offers a great process variation preventive effect. As described before as a comparative example of the process variation, as for the process variation when the cap layer is removed from the structure of the present example, it was experimentally observed that 70% or more electron mobility reduction occurred in the element manufacturing process because of the thin operating layer of 0.15 μm. This shows that it is impossible without the cap layer to utilize the high electron mobility, high sheet resistance thin InAsSb operating layer for the fabrication of the highly sensitive magnetic sensor. The present invention solves such a very important problem. In particular, the AlInSb cap layer maintains the lattice matching of the operating layer surface accurately, and prevents the damage to the operating layer. In addition, the GaAs protective layer protects the AlInSb surface layer from the impact of the plasma or from the effect of the lattice mismatch with the inorganic insulating layer formed as the passivation, and has a role of maintaining the characteristics of the high electron mobility operating layer. The process variation within 5% is due to conditions different from the characteristic deterioration of the operating layer, that is, due to process conditions completely different from such a problem of accuracy of the element pattern formation.

It is expected that the temperature dependence of the electron mobility and sheet resistance will be reduced by doping donor impurity atoms Sn into the InAsSb of the operating layer. Accordingly, doping of Sn into the InAsSb of the AlInSb/InAsSb/AlInSb stacked structure was tried. The method thereof is to irradiate the substrate surface with the Sn beam while growing the InAsSb crystal by the MBE method, thereby carrying out doping.

The test results are shown below. Table 1 shows characteristics of undoped $InAs_{0.09}Sb_{0.91}$ thin film conducting layer fabricated in several film thicknesses.

TABLE 1

Characteristics of undoped $InAs_{0.09}Sb_{0.91}$
thin film conducting layer fabricated

| film thickness (nm) | electron mobility $cm^2/Vs$ | sheet resistance/□ |
|---|---|---|
| 30 | 38,000 | 520 |
| 100 | 38,000 | 300 |
| 150 | 38,000 | 170 |

Furthermore, Table 2 shows characteristics of thin film conducting layer when Sn was doped.

TABLE 2

Characteristics of Sn doped $InAs_{0.09}Sb_{0.91}$
thin film conducting layer fabricated

| film thickness (nm) | electron mobility $cm^2/Vs$ | sheet resistance/□ |
|---|---|---|
| 30 | 34,000 | 500 |
| 100 | 34,000 | 180 |

Figure 6:
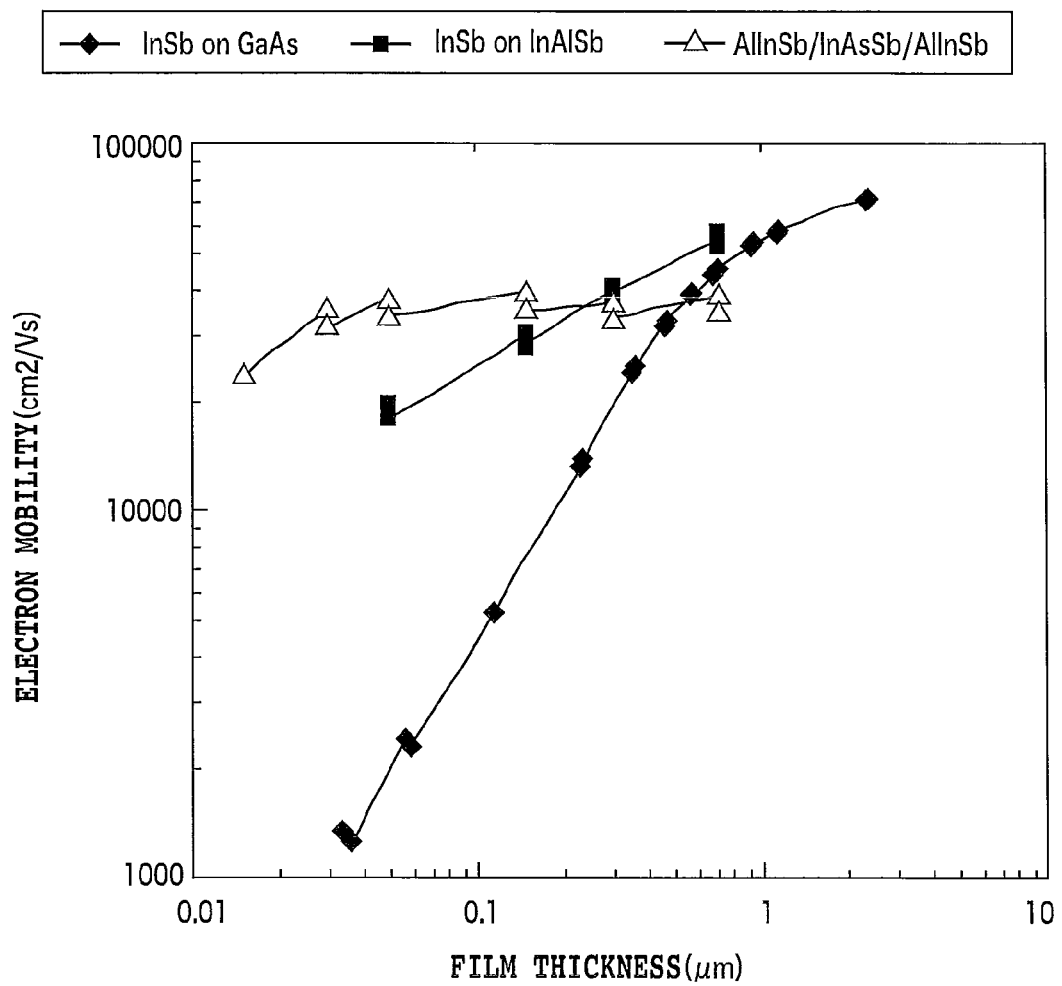
FIG. 6 is a diagram showing, in a thin film lamination in accordance with the present invention, the film thickness dependence of the electron mobility in an InAsSb thin film conducting layer on which an AlInSb mixed crystal layer is stacked, and the film thickness dependence of the electron mobility in InSb thin film conducting layers.

FIG. 6 is a diagram showing the film thickness dependence of the electron mobility in the InAsSb thin film conducting layer and in the InSb thin film conducting layer, which are sandwiched between the AlInSb mixed crystal layers in the thin film lamination in accordance with the present invention.

Examples of the film thickness dependence of the $InAs_{0.09}Sb_{0.91}$ thin film conducting layer sandwiched between the 0.7 μm thick $Al_{0.1}In_{0.9}Sb$ mixed crystal layers which are lattice matched insulating layers, and of the film thickness dependence of the InSb with the lattice mismatch of 0.5% which is sandwiched between the $Al_{0.1}In_{0.9}Sb$ mixed crystal layers are shown in comparison with a case where InSb is directly formed on a GaAs substrate. It is found that at the film thickness less than 0.6 μm, the effect of sandwiching between the $Al_{0.1}In_{0.9}Sb$ mixed crystal layers in accordance with the present invention becomes conspicuous, and the reduction of the electron mobility involved in the film thickness becomes very small. As for the InAsSb, the improving effect of the electron mobility of 20 times or more is observed at 20 nm, and the electron mobility little reduces at 500 nm or less. Thus, great effect of eliminating the lattice mismatch can be observed.

The results demonstrate the effect of reducing the lattice mismatch between the operating layer and the buffer layer 2 and cap layer 4 constituting the AlInSb, where the present invention employs to 0.5% or less, and of reducing the lattice mismatch to ±0.2% or less, or zero.

Figure 7:
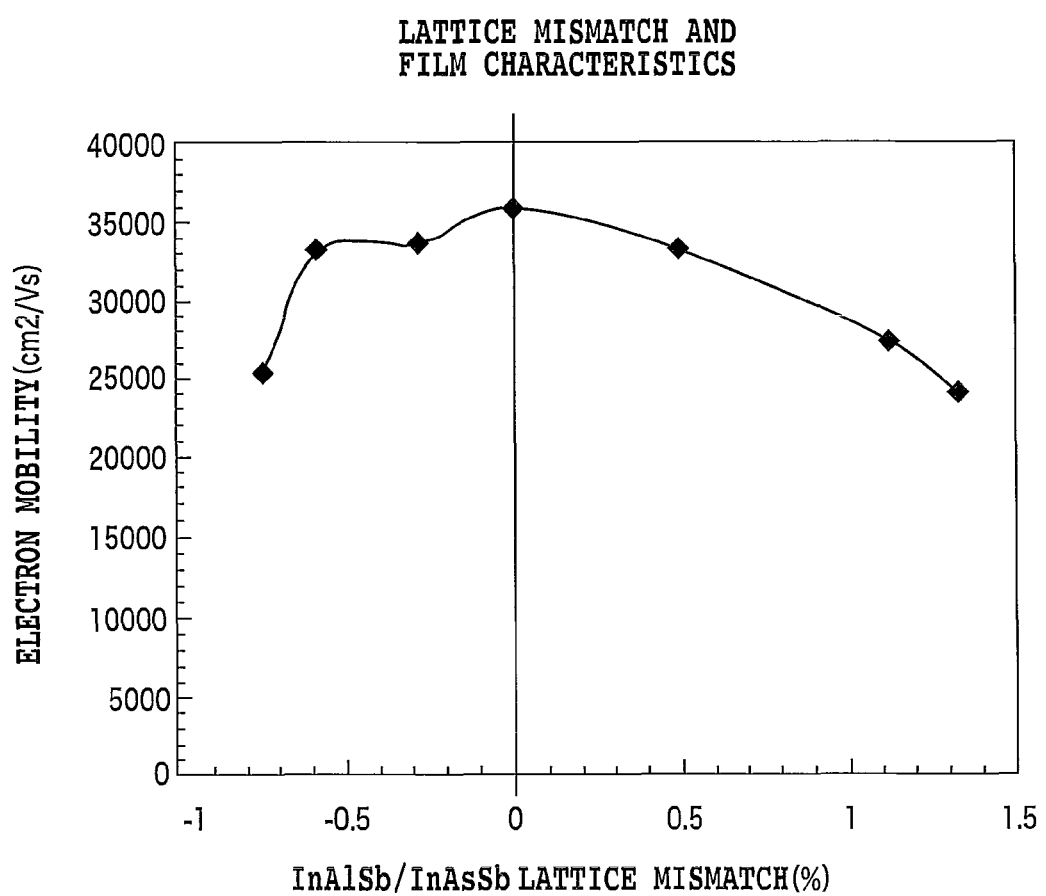
FIG. 7 is a diagram showing relationships between the lattice mismatch between an InAsSb thin film conducting layer and an AlInSb mixed crystal layer and the electron mobility in them.

FIG. 7 is a diagram showing relationships between the electron mobility and the lattice mismatch between the InAsSb thin film conducting layer and AlInSb mixed crystal layers. Here, the lattice mismatch was estimated by obtaining the lattice constant by X-ray diffraction. It shows a state in which the InAsSb electron mobility increases as the InAsSb lattice constant approaches the lattice constant of the buffer layer and cap layer composed of the $Al_{0.1}In_{0.9}Sb$ mixed crystal layers. In this case, the Al composition of the buffer layer is 10%, and at the point at which the lattice matching is achieved, the As composition is 9%, and hence the $InAs_{0.09}Sb_{0.91}$ thin film conducting layer becomes the operating layer.

As shown in these examples, the $InAs_xSb_{1-x}$ thin film conducting layer, which is the operating layer in accordance with the present invention, has the high electron mobility and high sheet resistance, thereby making it possible to fabricate a highly sensitive Hall element or magneto-resistance element.

Besides, it is found from Table 2 that doping Sn into the InAsSb operating layer does not cause any large reduction of the electron mobility. In particular, it exhibits the electron mobility of 34,000 $cm^2/Vs$ at 0.03 μm (30 nm) film thickness, which shows the effectiveness of the present invention. Such high electron mobility is achieved for the first time in a thin film thickness of 30 nm.

Figure 8:
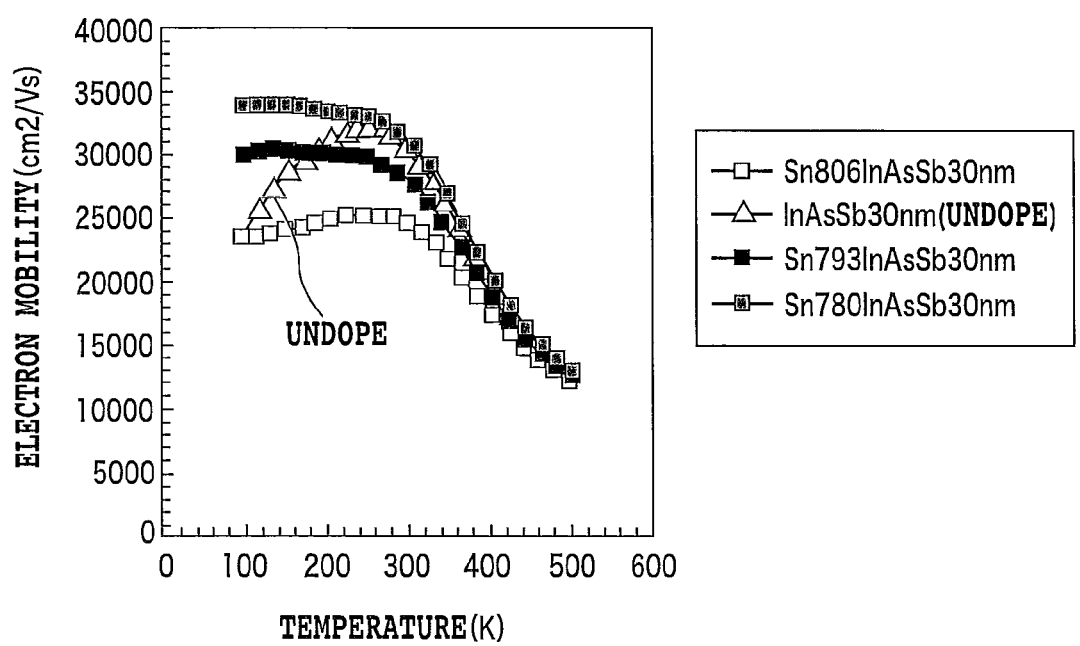
FIG. 8 is a diagram showing temperature characteristics of electron mobility in undoped and Sn-doped InAsSb that constitute a 30 nm thick InAsSb operating layer stacked on an AlInSb mixed crystal layer of a thin film lamination in accordance with the present invention.
Figure 9:
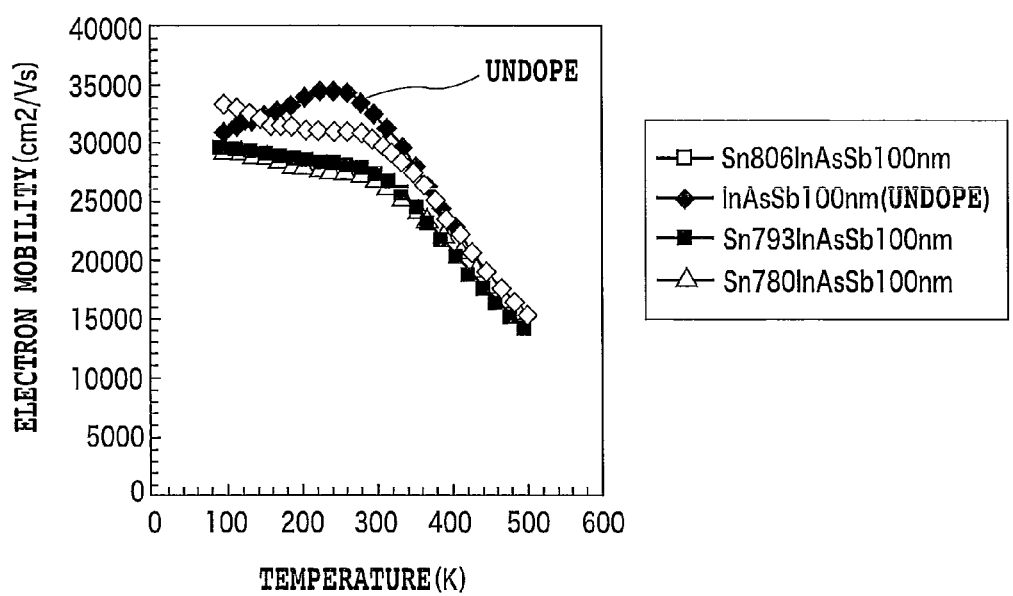
FIG. 9 is a diagram showing temperature characteristics of electron mobility in undoped and Sn-doped InAsSb that constitute a 100 nm thick InAsSb operating layer stacked on an AlInSb mixed crystal layer of a thin film lamination in accordance with the present invention.
Figure 10:
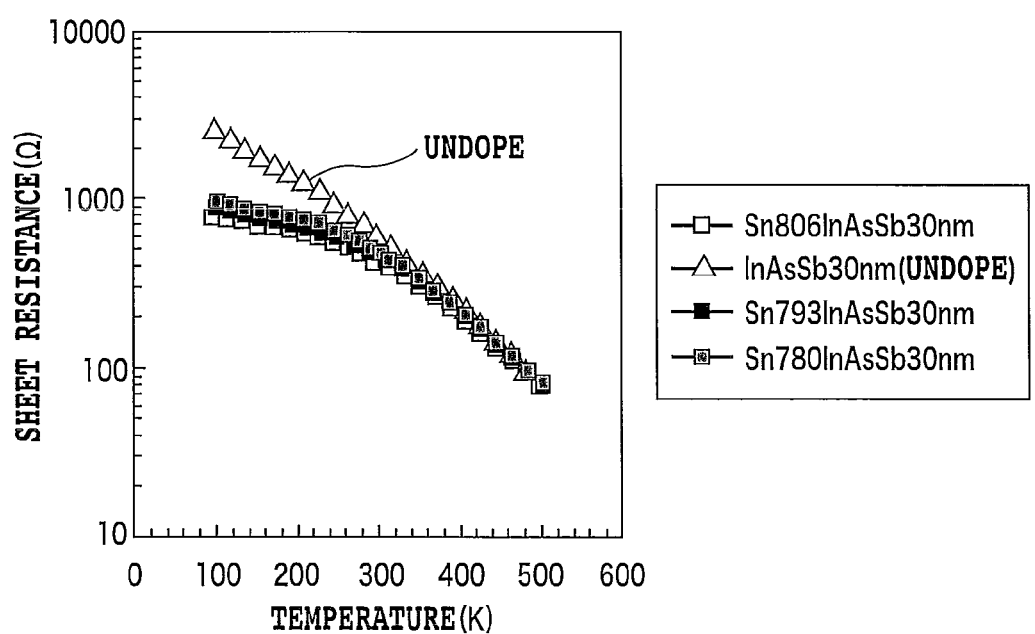
FIG. 10 is a diagram showing temperature characteristics of sheet resistance of undoped and Sn-doped InAsSb that constitute a 30 nm thick InAsSb operating layer stacked on an AlInSb mixed crystal layer of a thin film lamination in accordance with the present invention.
Figure 11:
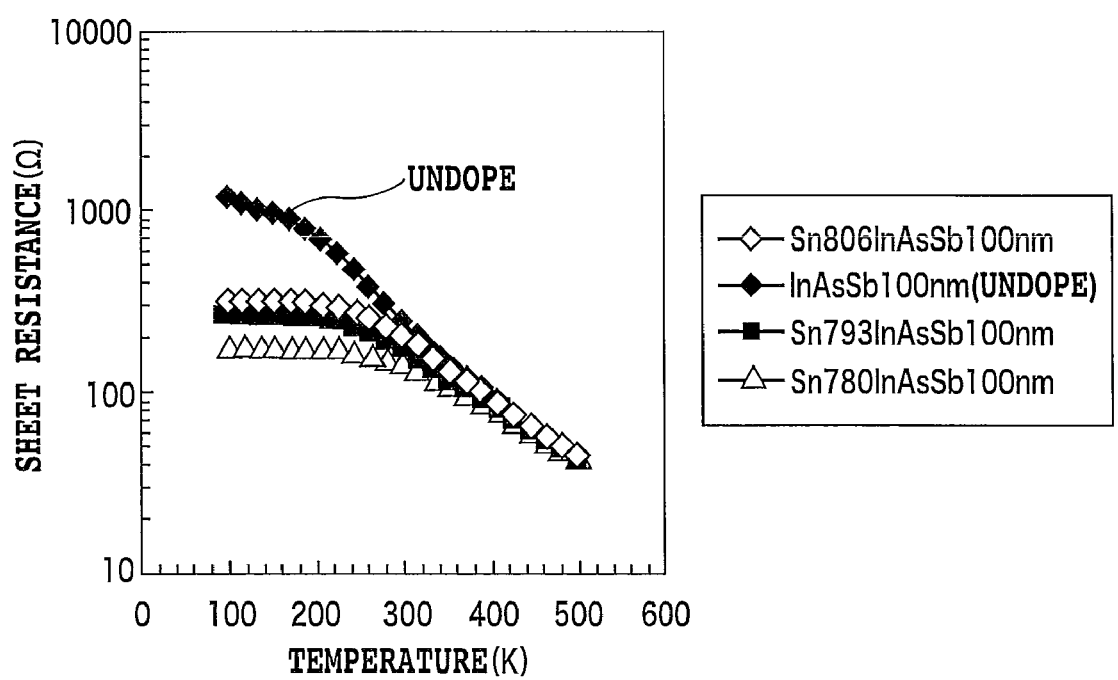
FIG. 11 is a diagram showing temperature characteristics of sheet resistance of undoped and Sn-doped InAsSb that constitute a 100 nm thick InAsSb operating layer stacked on an AlInSb mixed crystal layer of a thin film lamination in accordance with the present invention.

Furthermore, FIG. 8 and FIG. 9 are diagrams each showing that the temperature dependence of the electron mobility in the $InAs_{0.09}Sb_{0.91}$ thin film conducting layer constituting the operating layer can be reduced by doping Sn in examples of 30 nm and 100 nm thickness, respectively. In addition, FIG. 10 and FIG. 11 are diagrams each showing that the temperature dependence of the sheet resistance of the $InAs_{0.09}Sb_{0.91}$ constituting the operating layer can be reduced by doping Sn in the examples of 30 nm and 100 nm thickness, respectively. These diagrams each show data when Sn is not doped, and when Sn is doped by evaporating Sn at temperatures 780° C., 793° C. and 806° C. The amount of doping increases as the temperature of evaporating Sn rises. Besides, the electron density increases in proportion. As shown in the example, doping donor atoms such as Sn, Si, Te, Se or S into the operating layer in accordance with the present invention can increase the electron density of the operating layer and reduce the temperature dependence of the sheet resistance and the temperature dependence of the electron mobility. In particular, as described above, it is preferable to dope Sn. It is also found that the effect becomes more conspicuous as the amount of doping increases. This means that it enables fabricating a magnetic sensor with small temperature dependence, which is practically an important advantage of the present invention.

The foregoing is the description made by way of example that limits the buffer layer 2 to only AlInSb. However, it is not limited to the composition, and the buffer layer 2 of AlGaInSb obtained by adding Ga can also be employed, which also falls within the technical scope of the present invention. More specifically, although the Al composition in the buffer layer increases with an increase of the ratio of the As composition in the InAsSb thin film conducting layer, it is also possible to use a buffer layer adjusted to achieve the lattice matching with the InAsSb by adding Ga in a range without losing insulation. Adding Ga has merits in reducing the Al component, and an increase of the corrosion resistance of the buffer layer is expected.

Next, as for the substrates employed in the present invention, some of them other than GaAs will be described. It is enough for the substrate 1 used in the present invention to have heat resistance and insulation. It is not limited to a GaAs single crystal substrate. In addition, as long as an insulating or high resistance $Al_xGa_yIn_{1-x-y}Sb$ mixed crystal layer can be grown on it, its insulation is not necessarily important in particular.

In the present invention, the substrate 1 is normally composed of a material which is stable at high temperature, and a substrate having insulation or high resistance and a flat surface is used. Accordingly, an insulating single crystal substrate, which can provide a crystal face with a flat surface, is preferably used. In particular, insulating substrates composed of GaAs, InP or the like are preferably used. Alternatively, any substrates will do as long as they have an insulating or high resistance thin layer formed on their surfaces, and are substantially equivalent to a substrate having a flat surface composed of a thin layer formed with insulation or high resistance.

In addition, a Si single crystal substrate having a thin insulating layer formed on its surface is also used as the substrate 1 because an insulating flat surface with the same crystal structure as a GaAs substrate, a GaAs insulating compound semiconductor layer can be obtained by further placing on its surface. A sapphire substrate with good insulation is also preferable.

Next, the surface of the substrate must be flat. The term "flat" here refers to a state in which the surface asperities are 5 nm or less, and more preferably 1 nm or less, and in the optimum case, to a state in which the crystal lattice plane consisting of atoms constituting the substrate is arranged in a flatness of a single atom layer on the surface of the substrate in parallel with the lattice plane, that is, the substrate is a single crystal substrate and has a flatness equal to or less than a single atom layer consisting of the crystal lattice plane. Alternatively, a flatness equal to or less than the spacing of a single lattice plane is the most desirable flatness.

As for the substrate, it does not matter in particular whether it is a single crystal, polycrystal or in an amorphous state as long as it has insulation or high resistance. However, a single crystal with the same crystal structure as InAsSb is optimum, and further III-V compound semiconductor single crystal is desirable, and an insulating or semiconductor substrate such as GaAs, InP or GaN is preferable.

It is preferable that the surfaces of the single crystal substrates are formed along the crystal lattice plane, and furthermore, they can also be formed at a certain angle (of about 0-10 degrees) with the crystal face to facilitate crystal growth. For example, in an example of a GaAs substrate, a surface can sometimes be formed which is inclined in a range about 0 to 10 degrees from the substrate plane of (100), (111), (110) and the like, which is preferable. The surface of the substrate can be used regardless of the foregoing index planes. Planes with high indices on which crystal growth has been tried recently can also be used. When using a substrate of a material different from III-V compound semiconductors such as a single crystal sapphire substrate, Si, glass, silica glass $SiO_2$ or an alumina substrate composed of $Al_2O_3$, although it can be used as it is, it is necessary, more preferably, to form on its surface an insulating layer or high resistance layer composed of a III-V compound semiconductor.

Utilizing such a thin film lamination in accordance with the present invention enables fabrication of magnetic sensors such as highly sensitive Hall elements. The following are examples showing that highly sensitive magnetic sensor fabrication becomes possible by using a very thin InAsSb thin film as the operating layer by applying the thin film lamination in accordance with the present invention.

Hall Element Magnetic Sensor Fabrication Example 1

Characteristics will be described of a Hall element fabricated by using the 0.15 μm thick $InAs_{0.09}Sb_{0.91}$ thin film conducting layer as the magnetic sensor section. FIG. 4A shows a sectional structure of a Hall element chip fabricated from the thin film lamination in accordance with the present invention. In FIG. 4B, the reference numeral 9 (91, 92, 93 and 94) designates four terminal electrodes. The electrodes 9 are sometimes constructed in a 3-layer stacked structure composed of a layer normally making ohmic contact with the operating layer 3, an intermediate layer thereon, and a bonding layer at the top, which is composed of a metal like gold. The reference numeral 3 designates a pattern portion of the operating layer (thin film conducting layer) of the Hall element.

A fabrication procedure: on a 0.35 mm thick GaAs substrate 1, a 0.7 μm thick $Al_{0.1}In_{0.9}Sb$ mixed crystal layer 2 constituting a buffer layer was grown; a 0.15 μm (150 nm) thick $InAs_{0.09}Sb_{0.91}$ thin film conducting layer 3 was grown thereon; then a 0.05 μm thick $Al_{0.1}In_{0.9}Sb$ mixed crystal layer 4 of the cap layer was grown; and a 0.0065 μm thick GaAs protective layer 5 was grown. As for its characteristics, the electron mobility is 38,000 $cm^2$/Vs and the sheet resistance is 170Ω (ohm)/□ as shown in Table 1.

The fabrication of the Hall element passed through: etching of the protective film, cap layer, and then the InAsSb layer of the operating layer by photolithography; then removing the protective film and cap layer at portions of the terminal electrodes by etching; and forming the 3-layer terminal electrodes of Ti/Ni/Au by a lift-off technique using photolithography. The chip size was 0.36 $mM^2$ and the element pattern was made cross-shaped. The Hall voltage of the Hall element thus fabricated was 153 mV at the driving voltage of 1 V and magnetic flux density of 0.1 T, which has at very high Hall voltage showing high magnetic field sensitivity. In addition, the input resistance of the element is 380Ω (ohm). The offset voltage Vu, the voltage across the Hall terminals when no magnetic field is applied, is also small, that is, 0.3 mV at the driving voltage of 1 V. In this way, using the thin film lamination in accordance with the present invention enables fabricating highly sensitive magnetic sensors.

Hall Element Magnetic Sensor Fabrication Example 2

Next, characteristics will be described of a Hall element fabricated by using the 0.10 μm thick $InAs_{0.09}Sb_{0.91}$ thin film conducting layer as the magnetic sensor section. FIG. 4A shows a sectional structure thereof.

A fabrication procedure: on a 0.35 mm thick GaAs substrate 1, a 0.7 μm thick $Al_{0.1}In_{0.9}Sb$ mixed crystal layer 2 constituting a buffer layer was grown; a 0.10 μm (100 nm) thick $InAs_{0.09}Sb_{0.91}$ thin film conducting layer 3 was grown thereon; then an $Al_{0.1}In_{0.9}Sb$ mixed crystal layer 4 was grown as a 0.05 μm thick cap layer; and a 0.0065 μm thick GaAs protective layer 5 was grown. As for the characteristics of the thin film lamination thus fabricated, the electron mobility is 38,000 $cm^2$/Vs and the sheet resistance is 300Ω (ohm)/□ as shown in Table 1.

The fabrication of the Hall element passed through: etching of the protective film, cap layer, and then the InAsSb the operating layer by using photolithography; then removing the protective film and cap layer at portions of the terminal electrodes by etching; and forming the 3-layer terminal electrodes of Ti/Ni/Au by a lift-off technique using photolithography. The chip size was 0.36 $mm^2$ and the element pattern was made cross-shaped. The Hall voltage of the Hall element thus fabricated was 190 mV at the driving voltage of 1 V and magnetic flux density of 0.1 T, which has a very high Hall voltage showing high magnetic field sensitivity. In addition, the input resistance of the element is 620Ω (ohm) The offset voltage Vu, the voltage across the Hall terminals when no magnetic field is applied, is also small, that is, 0.12 mV at the driving voltage of 1 V. Thus, the element has very high sensitivity and high output.

Hall Element Magnetic Sensor Fabrication Example 3

Next, characteristics will be described of a Hall element fabricated by using the 0.03 μm thick $InAs_{0.09}Sb_{0.91}$ thin film conducting layer as the magnetic sensor section. FIG. 4A shows a sectional structure thereof.

A fabrication procedure: on a 0.35 mm thick GaAs substrate 1, a 0.7 μm thick $Al_{0.1}In_{0.9}Sb$ mixed crystal layer 2 constituting a buffer layer was grown; a 0.03 μm (30 nm) thick $InAs_{0.09}Sb_{0.91}$ thin film conducting layer 3 doped with Sn was grown thereon; then a 0.05 μm thick $Al_{0.1}In_{0.9}Sb$ mixed crystal layer 4 of the cap layer was grown; and a 0.0065 μm thick GaAs protective layer 5 was grown. As for the characteristics thereof, the electron mobility is 34,000 $cm^2$/Vs and the sheet resistance is 500Ω (ohm)/□ as shown in Table 1.

The fabrication of the Hall element passed through: etching of the protective film, cap layer, and then the InAsSb layer of the operating layer by photolithography; then removing etching of the protective film and cap layer at the terminal electrodes; and forming the 3-layer terminal electrodes of Ti/Ni/Au by a lift-off technique using photolithography. The chip size was 0.36 $mm^2$ and the element pattern was made cross-shaped. The Hall voltage of the Hall element thus fabricated was 170 mV at the driving voltage of 1 V and magnetic flux density of 0.1 T, which has a very high Hall voltage showing high magnetic field sensitivity. In addition, the input resistance of the element was 980Ω (ohm). The offset voltage Vu, the voltage across the Hall terminals when no magnetic field is applied, was also small, that is, 0.1 mV at the driving voltage of 1 V. Since the element has large temperature dependence and small input resistance, it can be driven even at the driving voltage of 3 V. The Hall voltage which is the magnetic sensor output at this time is three times the foregoing, providing a large value of 510 mV, which means that the element has very high sensitivity and high output voltage.

Magneto-Resistance Element Magnetic Sensor Fabrication Example 1 (MR)

Next, fabrication of a magneto-resistance element, which was fabricated by using as the magnetic sensor section the thin film lamination employed in the Hall element experimental product 1, that is, the 0.15 μm thick $InAs_{0.09}Sb_{0.91}$ thin film conducting layer, will be described along with its characteristics.

As shown in FIG. 3, the basic structure of the magneto-resistance element is a two-terminal element basically. However, since it is often fabricated in a three-terminal bridge structure practically, examples of fabricating a three-terminal magneto-resistance element will be described here.

Figure 12A:
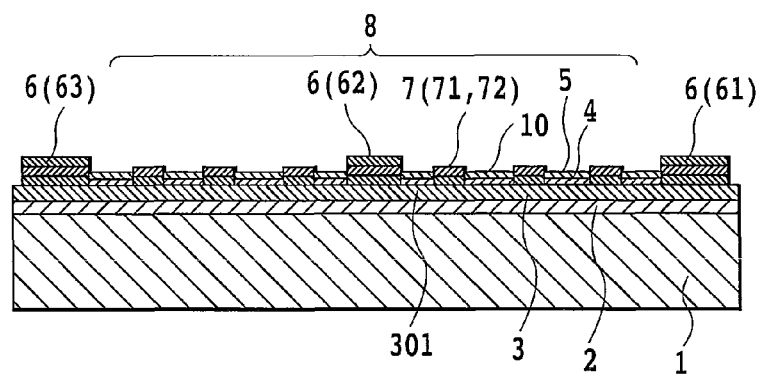
FIG. 12A is a sectional view showing a three-terminal magneto-resistance element chip fabricated with a thin film lamination.
Figure 12B:
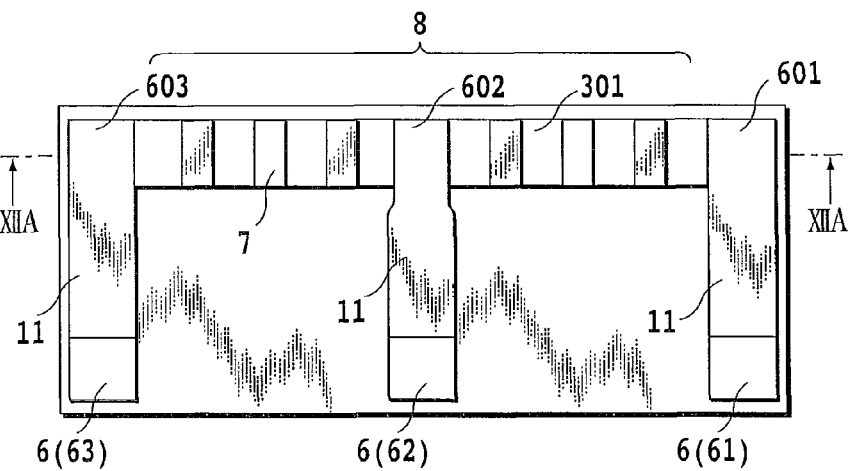
FIG. 12B is a top view showing a sectional structure of the three-terminal magneto-resistance element chip fabricated with the thin film lamination.

FIG. 12A and FIG. 12B are sectional structural views of a three-terminal magneto-resistance element chip fabricated using the thin film lamination in accordance with the present invention. In FIG. 12A, the reference numeral 6 designates 3-layer terminal electrodes for external connection. There are three terminal electrodes in the example. The reference numeral 7 (71 and 72) designates short-bar electrodes formed for increasing the magnetic resistance effect. They are an example formed as 2-layer laminated electrodes. FIG. 12B is a top view of the three-terminal magneto-resistance element chip fabricated using the thin film lamination in accordance with the present invention. The section taken along the broken line is shown in FIG. 12A. The reference numeral 8 designates the sensor section of the magneto-resistance element. Portions denoted by the reference numeral 301 are pattern portions 10 of the InAsSb operating layer exhibiting resistance changes in the magnetic field divided by short-bars. The element has an intermediate electrode 602 and terminal electrodes 601 and 603 for taking out the magnetic resistance changes. The electrodes are connected to the terminal electrodes 61, 62 and 63 for external connection, respectively.

The magneto-resistance element with the pattern has the electrodes for external connection connected to the intermediate electrode and terminal electrodes of the magneto-resistance element via wiring sections 11.

A fabrication procedure: on a 0.35 mm thick GaAs substrate 1, a 0.7 μm thick $Al_{0.1}In_{0.9}Sb$ mixed crystal layer 2 constituting a buffer layer was grown; a 0.15 μm (150 nm) thick $InAs_{0.09}Sb_{0.91}$ thin film conducting layer 3 was grown thereon; then a 0.05 μm thick $Al_{0.1}In_{0.9}Sb$ mixed crystal layer 4 of the cap layer was grown; and a 0.0065 μm thick GaAs protective layer 5 was grown. As for its characteristics, the electron mobility is 38,000 $cm^2$/Vs and the sheet resistance is 170Ω (ohm)/□ as shown in Table 1. The stacked structure of the thin film lamination has the sectional structure shown in FIG. 2D.

The fabrication of the magneto-resistance element carried out: etching of the protective film, cap layer, and then the InAsSb layer of the operating layer by using photolithography; then removing the protective film and cap layer at portions of the terminal electrodes by etching; and forming the terminal electrodes of the 3-layer electrodes of Ti/Ni/Au by a lift-off technique using photolithography. Subsequently, to form the short-bar electrode sections, the AlInSb cap layer 4 on the surface of the InAsSb operating layer and the GaAs layer constituting the thin protective layer 5 were removed by etching. In this way, the short-bar electrodes were formed in a structure having Ti of the short-bar electrodes make direct contact with the InAsSb. Furthermore, the short-bar electrodes with the 2-layer structure of Ti/Ni were formed by the lift-off technique.

The chip size of the three-terminal magneto-resistance element thus fabricated was 3.1 mm×1.5 mm, and the ratio W/L between the interval L of the short-bar electrodes and the width W of the current channel of the magneto-resistance element was 0.2 (W/L is called a geometric ratio of the pattern that brings about the magnetic resistance effect). As for the magneto-resistance element thus fabricated, since it was fabricated as a three-terminal magneto-resistance element, and the resistance values of the magneto-resistance element divided by the intermediate electrode were designed to have the same value, the measurement results were 350Ω (ohm), respectively. Accordingly, the input resistance of the magneto-resistance element was 700Ω (ohm). The offset voltage Vu, the voltage across the Hall terminals when no magnetic field is applied, is also small, and a deviation from the intermediate electrode potential of 2.5 V was 1.2 mV at the driving voltage 5 V. The resistance changes of the magneto-resistance element exhibited 250% at the magnetic flux density 0.5 T, and linear resistance changes occurred in the neighborhood in response to minute magnetic flux changes. Its sensitivity was very high, and it was found that it had sensitivity even for 1 μT magnetic field changes.

Magneto-Resistance Element Magnetic Sensor Fabrication Example 2 (MR)

Next, fabrication of a magneto-resistance element, which was fabricated by using as the magnetic sensor section the thin film lamination shown in Table 2, that is, the 0.03 μm thick $InAs_{0.09}Sb_{0.91}$ thin film conducting layer, will be described along with its characteristics.

As shown in FIG. 3, the basic structure of the magneto-resistance element is a two-terminal element basically. However, since it is often fabricated in a three-terminal bridge structure practically, examples of fabricating a three-terminal magneto-resistance element will be described here.

FIG. 12A and FIG. 12B are sectional structural views of a three-terminal magneto-resistance element chip fabricated using the thin film lamination in accordance with the present invention. In FIG. 12A, the reference numeral 6 designates 3-layer terminal electrodes for external connection. There are three terminal electrodes in the example. The reference numeral 7 (71 and 72) designates short-bar electrodes formed for increasing the magnetic resistance effect. They are an example formed as 2-layer laminated electrodes. FIG. 12B is a top view of the three-terminal magneto-resistance element chip fabricated using the thin film lamination in accordance with the present invention. The section taken along the broken line is shown in FIG. 12A. The reference numeral 8 designates the sensor section of the magneto-resistance element. Portions denoted by the reference numeral 301 are pattern portions 10 of the InAsSb operating layer exhibiting resistance changes in the magnetic field divided by short-bars. The element has an intermediate electrode 602 and terminal electrodes 601 and 603 for taking out the magnetic resistance changes. The electrodes are connected to the terminal electrodes 61, 62 and 63 for external connection, respectively. The magneto-resistance element with the pattern has the electrodes for external connection connected to the terminal electrodes and intermediate electrode of the magneto-resistance element via wiring sections 11.

A fabrication procedure: on a 0.35 mm thick GaAs substrate 1, a 0.7 µm thick $Al_{0.1}In_{0.9}Sb$ mixed crystal layer 2 constituting a buffer layer was grown; a 0.03 µm (30 nm) thick $InAs_{0.09}Sb_{0.91}$ thin film conducting layer 3 doped with Sn was grown thereon; then a 0.05 µm thick $Al_{0.1}In_{0.9}Sb$ mixed crystal layer 4 of the cap layer was grown; and a 0.0065 µm thick GaAs protective layer 5 was grown. As for its characteristics, the electron mobility is 34,000 cm²/Vs and the sheet resistance is 500Ω (ohm)/□ as shown in Table 2. The stacked structure of the thin film lamination has the sectional structure shown in FIG. 2D.

The fabrication of the magneto-resistance element carried out: etching of the protective film, cap layer, and then the InAsSb layer of the operating layer by photolithography; then removing the protective film and cap layer at portions of the terminal electrodes by etching; and forming the terminal electrodes of the 3-layer electrodes of Ti/Ni/Au by a lift-off technique using photolithography. Subsequently, to form the short-bar electrode sections, the AlInSb cap layer 4 on the surface of the InAsSb operating layer and the GaAs layer constituting the thin protective layer 5 were removed by etching. In this way, the short-bar electrodes were formed in a structure having Ti of the short-bar electrodes make direct contact with the InAsSb. Furthermore, the short-bar electrodes with the 2-layer structure of Ti/Ni were formed by the lift-off technique.

The chip size of the three-terminal magneto-resistance element thus fabricated was 3.1 mm×1.5 mm, and the ratio W/L between the interval L of the short-bar electrodes and the width W of the current channel of the magneto-resistance element was 0.2 (W/L is called a geometric ratio of the pattern that brings about the magnetic resistance effect). As for the magneto-resistance element thus fabricated, it was fabricated as a three-terminal magneto-resistance element, and the resistance values of the magneto-resistance element divided by the intermediate electrode were designed to have the same value. Thus, the measurement results of the resistance values of the magneto-resistance element divided by the intermediate electrode were 930Ω (ohm), respectively. Accordingly, the input resistance of the magneto-resistance element was the sum of them, 1860Ω (ohm). The offset voltage Vu, the voltage across the Hall terminals when no magnetic field is applied, is also small, and a deviation from the intermediate electrode potential of 2.5 V was 1.0 mV at the driving voltage 5 V. The resistance changes of the magneto-resistance element exhibited 230% at the magnetic flux density 0.5 T, and linear resistance changes occurred in the neighborhood in response to minute magnetic flux density changes. Compared with the magneto-resistance element magnetic sensor fabrication example 1, the amount of the resistance changes due to magnetic field is not much different, and the magnetic field detection sensitivity is very high. Furthermore, since Sn was doped in this case, the temperature dependence of the rate of change of the resistance due to the magnetic resistance effect was very small. In addition, the temperature dependence of the input resistance at a time when no magnetic field is applied is also small, and furthermore, temperature changes of the offset voltage are also very small. As a result, it was able to detect the magnetic field changes of 1 µT with high stability. This is because the temperature changes of the resistance value do not affect the magnetic resistance changes, which is a great merit of employing the Sn-doped thin film lamination.

Magneto-Resistance Element Magnetic Sensor Fabrication Example 3 (MR)

Next, fabrication of a magneto-resistance element with the magnetic sensor section, which was fabricated by using the thin film lamination shown in Table 2, that is, the 0.10 µm thick $InAs_{0.09}Sb_{0.91}$ thin film conducting layer, will be described along with its characteristics.

As shown in FIG. 3, the basic structure of the magneto-resistance element is a two-terminal element basically. However, since it is often fabricated in a three-terminal bridge structure practically, examples of fabricating a three-terminal magneto-resistance element will be described here.

FIG. 12A and FIG. 12B are sectional structural views of a three-terminal magneto-resistance element chip fabricated using the thin film lamination in accordance with the present invention. In FIG. 12A, the reference numeral 6 designates 3-layer terminal electrodes for external connection. There are three terminal electrodes in the example. The reference numeral 7 (71 and 72) designates short-bar electrodes formed for increasing the magnetic resistance effect. They are an example formed as 2-layer laminated electrodes. FIG. 12B is a top view of the three-terminal magneto-resistance element chip fabricated using the thin film lamination in accordance with the present invention. The section taken along the broken line is shown in FIG. 12A. The reference numeral 8 designates the sensor section of the magneto-resistance element. Portions denoted by the reference numeral 301 are pattern portions 10 of the InAsSb operating layer exhibiting resistance changes in the magnetic field divided by short-bars. The element has an intermediate electrode 602 and terminal electrodes 601 and 603 for taking out the magnetic resistance changes. The electrodes are connected to the terminal electrodes 61, 62 and 63 for external connection, respectively. The magneto-resistance element with the pattern has the electrodes for external connection connected to the terminal electrodes and intermediate electrode of the magneto-resistance element via wiring sections 11.

A fabrication procedure: on a 0.35 mm thick GaAs substrate 1, a 0.7 µm thick $Al_{0.1}In_{0.9}Sb$ mixed crystal layer 2 constituting a buffer layer was grown; a 0.10 µm (100 nm) thick $InAs_{0.09}Sb_{0.91}$ thin film conducting layer 3 doped with Sn was grown thereon; then a 0.05 µm thick $Al_{0.1}In_{0.9}Sb$ mixed crystal layer 4 of the cap layer was grown; and a 0.0065 µm thick GaAs protective layer 5 was grown. As for its characteristics, the electron mobility is 34,000 cm²/Vs and the sheet resistance is 180Ω (ohm)/□ as shown in Table 2.

The stacked structure of the thin film lamination has the sectional structure shown in FIG. 2D.

The fabrication of the magneto-resistance element carried out: etching of the protective film, cap layer, and then the InAsSb layer of the operating layer by using photolithography; then removing the protective film and cap layer at portions of the terminal electrodes by etching; and forming the terminal electrodes of the 3-layer electrodes of Ti/Ni/Au by a lift-off technique using photolithography. Subsequently, to form the short-bar electrode sections, the AlInSb cap layer 4 on the surface of the InAsSb operating layer and the GaAs layer constituting the thin protective layer 5 were removed by etching. In this way, the short-bar electrodes were formed in a structure having Ti of the short-bar electrodes make direct contact with the InAsSb. Furthermore, the short-bar electrodes with the 2-layer structure of Ti/Ni were formed by the lift-off technique.

The chip size of the three-terminal magneto-resistance element thus fabricated was 3.1 mm×1.5 mm, and the ratio W/L between the interval L of the short-bar electrodes and the width W of the current channel of the magneto-resistance element was 0.2 (W/L is called a geometric ratio of the pattern that brings about the magneto-resistance effect). As for the magneto-resistance element thus fabricated, it was fabricated as a three-terminal magneto-resistance element, and the resistance values of the magneto-resistance element divided by the intermediate electrode were designed to have the same value. Thus, the measurement results of the resistance values of the magneto-resistance element divided by the intermediate electrode were 370Ω (ohm), respectively. Accordingly, the input resistance of the magneto-resistance element was the sum of them, 740Ω (ohm). The offset voltage Vu, the voltage across the Hall terminals when no magnetic field is applied, was also small, and a deviation from the intermediate electrode potential of 2.5 V was 0.8 mV at the driving voltage 5 V. The resistance changes of the magneto-resistance element exhibited 230% at the magnetic flux density 0.5 T, and linear resistance changes occurred in the neighborhood in response to minute magnetic flux changes. Compared with the magneto-resistance element magnetic sensor fabrication example 1, the amount of the resistance changes due to magnetic field is not much varied, and the magnetic field detection sensitivity is very high. Furthermore, since Sn is doped in this case, the temperature dependence of the rate of change of the resistance due to the magnetic resistance effect was very small. In addition, the temperature dependence of the input resistance at a time when no magnetic field is applied is also small, and furthermore, temperature changes of the offset voltage are also very small. As a result, it was able to detect the magnetic field changes of 1 µT with high stability. This is because the temperature changes of the resistance value do not affect the magneto-resistance changes, which is a great merit of employing the Sn-doped thin film lamination.

As shown in the examples, the present invention was able to fabricate the highly sensitive Hall element or magneto-resistance element using the InAsSb thin film of 1 µm or less in thickness. In particular, a magneto-resistance element capable of detecting the changes of the weak magnetic field is suitable for detecting a printed pattern of magnetic ink or detecting rotation of an iron gear with minute pitch. Thus, it can be expected that it will broaden the applications to various fields in which it is difficult to apply the conventional thin films.

Incidentally, as for the magneto-resistance element in accordance with the present invention, it is possible to fabricate a 2-terminal element, 3-terminal element or 4-terminal full bridge element. Any of them fall within the technical scope of the present invention.

Besides, although the foregoing examples do not mention of the packages of the magnetic sensors in accordance with the present invention, various types of packages are applicable to the foregoing magnetic sensors in accordance with the present invention, and they fall within the technical scope of the present invention even if they are packaged.

Next, other examples in accordance with the present invention will be described.

In the Hall element magnetic sensor fabrication example 1 in accordance with the present invention, only the Hall element fabricated is normally put into a resin package directly. The package is a means for facilitating the use of the magnetic sensor in accordance with the present invention, and the Hall element or magneto-resistance element in accordance with the present invention thus packaged also falls within the technical scope of the present invention. This applies to other packaging as well.

There are still other examples. As for the Hall element, its magnetic field detection signal, that is, the Hall voltage, is used after being amplified by an amplification circuit. Accordingly, it is also carried out to fabricate an electronic circuit for amplifying the signal of the Hall element into a Si integrated circuit in advance, and then to put the Si integrated circuit chip and the Hall element chip into a single package after electrically connecting them by wires. Such a Hall element, which is sometimes called a hybrid Hall IC, is essentially a circuit for simply amplifying the function of the Hall element with the amplification circuit, and falls within the technical scope of the present invention. In other words, it is an InAsSb thin film magnetic sensor in accordance with the present invention characterized by being electrically connected with the Si integrated circuit chip used for amplifying the magnetic sensor signal and put into a single package. In such an example, the amplification circuit is roughly divided into two types. A first type is an amplification circuit for amplifying the Hall voltage proportional to the magnetic field as it is in an analog fashion.

The InAsSb thin film magnetic sensor in accordance with the present invention is sometimes combined and electrically connected with the analog amplification circuit and is put into a single package. In this case, the Hall voltage passing through the amplification circuit is proportional to the magnetic field. Although it is sometimes referred to as an analog hybrid Hall IC, it also falls within the technical scope of the present invention.

A second type is a circuit that has a threshold of magnetic field with a certain level set in the amplification circuit with respect to the detection and non-detection of the magnetic field, and outputs a fixed voltage from the output terminal in an on-and-off manner in response to the detection or non-detection of the magnetic field equal to or greater than the threshold. For example, it is a digital amplification circuit whose output terminal voltage varies between a ground level (low level) and a power supply voltage level (high level). Being combined and electrically connected with such a digital amplification circuit, the InAsSb thin film magnetic sensor is sometimes put into a single package and used. It is referred to as a digital hybrid Hall IC and falls within the technical scope of the present invention. The amplified Hall voltage is obtained as a digital signal output that changes in an on-and-off fashion.

Such an InAsSb thin film magnetic sensor in accordance with the present invention is very frequently used in the same single package with an amplifier composed of a Si integrated circuit chip, and falls within the technical scope of the present invention.

Although there are cases where a Hall element is used as the magnetic sensor, a magneto-resistance element can also be used. In this case, although a magneto-resistance element IC is sometimes named, simply.

The invention claimed is:

1. A thin film lamination having mixed crystal layer and thin film conducting layer comprising:
    an $Al_xIn_{1-x}Sb$ mixed crystal layer ($0.08 \leq x \leq 1$) formed on a substrate; and
    an $InAs_xSb_{1-x}$ ($0 < x \leq 1$) thin film conducting layer formed directly on the $Al_xIn_{1-x}Sb$ mixed crystal layer, wherein
    the $Al_xIn_{1-x}Sb$ mixed crystal layer is a layer that exhibits higher resistance than the $InAs_xSb_{1-x}$ thin film conducting layer or that exhibits insulation or p-type conductivity, and by having a band gap greater than the $InAs_xSb_{1-x}$ thin film conducting layer and by having a lattice mismatch of +1.3% to −0.8%.

2. The thin film lamination according to claim 1, wherein the $Al_xIn_{1-x}Sb$ mixed crystal layer having percentage (x) of content of Al atoms of 8% to 30% ($0.08 \leq x \leq 0.3$).

3. The thin film lamination according to claim 1, wherein the $InAs_xSb_{1-x}$ thin film conducting layer is doped with at least one of Te, S, Se, Sn, Si and Ge, which belong to VI group atoms or IV group atoms as donor impurities.

4. The thin film lamination according to claim 1, wherein the full width at half maximum of X-ray diffraction of the $Al_xIn_{1-x}Sb$ mixed crystal layer or of the $Al_xGa_yIn_{1-x-y}Sb$ mixed crystal layer is 50 seconds to 1,000 seconds.

5. The thin film lamination according to claim 1, wherein a lattice mismatch between the $Al_xIn_{1-x}Sb$ mixed crystal layer or the $Al_xGa_yIn_{1-x-y}Sb$ mixed crystal layer and the $InAs_xSb_{1-x}$ thin film conducting layer is +1.3% to −0.8%.

6. The thin film lamination according to claim 1, wherein a lattice mismatch between the $Al_xIn_{1-x}Sb$ mixed crystal layer or the $Al_xGa_yIn_{1-x-y}Sb$ mixed crystal layer and the $InAs_xSb_{1-x}$ thin film conducting layer is ±0.2% or less.

7. The thin film lamination according to claim 1, wherein the $InAs_xSb_{1-x}$ ($0 < x \leq 1$) thin film conducting layer having a film thickness of 100 nm or less and 10 nm or more and electron mobility of 30,000 cm$^2$/Vs or more.

8. The thin film lamination according to claim 1, comprising:
    the substrate is a GaAs substrate;
    the $Al_xIn_{1-x}Sb$ mixed crystal layer is an $Al_{0.1}In_{0.9}Sb$ mixed crystal layer; and
    the $InAs_xSb_{1-x}$ thin film conducting layer is an $InAs_{0.09}Sb_{0.91}$ thin film conducting layer.

9. The thin film lamination according to claim 1, comprising:
    an $Al_xIn_{1-x}Sb$ mixed crystal layer ($0.08 \leq x \leq 1$) or an $Al_xGa_yIn_{1-x-y}Sb$ mixed crystal layer ($0 < x+y \leq 1, x \neq 0$) directly formed on the $InAs_xSb_{1-x}$ ($0 < x \leq 1$) thin film conducting layer as a cap layer, wherein
    the $Al_xIn_{1-x}Sb$ mixed crystal layer cap layer or the $Al_xGa_yIn_{1-x-y}Sb$ mixed crystal layer cap layer is a layer that exhibits higher resistance than the $InAs_xSb_{1-x}$ thin film conducting layer or that exhibits insulation or p-type conductivity, and by having a band gap greater than the $InAs_xSb_{1-x}$ thin film conducting layer, and by having a lattice mismatch of +1.3% to −0.8% with the $InAs_xSb_{1-x}$ thin film conducting layer.

10. The thin film lamination according to claim 9, comprising:
    the substrate is a GaAs substrate;
    the $Al_xIn_{1-x}Sb$ mixed crystal layer is an $Al_{0.1}In_{0.9}Sb$ mixed crystal layer;
    the $InAs_xSb_{1-x}$ thin film conducting layer is an $InAs_{0.09}Sb_{0.91}$ thin film conducting layer; and
    the $Al_xIn_{1-x}Sb$ mixed crystal layer of the cap layer is an $Al_{0.1}In_{0.9}Sb$ mixed crystal layer, wherein
    further comprising a GaAs protective film on the cap layer of the $Al_{0.1}In_{0.9}Sb$ mixed crystal layer as a cap layer.

11. The thin film lamination according to claim 1, comprising:
    a GaAs insulating layer is formed on the substrate;
    the AlInSb mixed crystal layer is formed thereon;
    the InAsSb conducting layer is formed next;
    an AlInSb layer is further formed on the InAsSb conducting layer as a cap layer; and
    an insulating thin GaAs cap layer is further formed on the AlInSb cap layer.

12. A thin film magnetic sensor characterized by employing the $InAs_xSb_{1-x}$ thin film conducting layer of the thin film lamination according to claim 1 as an operating layer.

13. The thin film magnetic sensor according to claim 12, wherein the thin film magnetic sensor and a Si integrated circuit chip for amplifying a sensor signal of the thin film magnetic sensor are electrically connected, and are put into a single package.

14. A thin film magnetic sensor characterized by employing the $InAs_xSb_{1-x}$ thin film conducting layer of the thin film lamination according to claim 3 as an operating layer.

15. The thin film magnetic sensor according to claim 14, wherein the thin film magnetic sensor and a Si integrated circuit chip for amplifying a sensor signal of the thin film magnetic sensor are electrically connected, and are put into a single package.

16. A thin film magnetic sensor characterized by employing the thin film conducting layer in the thin film lamination according to claim 1 as an operating layer of an element utilizing Hall effect or of an element utilizing magnetic resistance effect.

17. The thin film magnetic sensor according to claim 16, wherein the thin film magnetic sensor and a Si integrated circuit chip for amplifying a sensor signal of the thin film magnetic sensor are electrically connected, and are put into a single package.

18. A thin film magnetic sensor characterized by employing the thin film conducting layer in the thin film lamination according to claim 3 as an operating layer of an element utilizing Hall effect or of an element utilizing magnetic resistance effect.

19. The thin film magnetic sensor according to claim 18, wherein the thin film magnetic sensor and a Si integrated circuit chip for amplifying a sensor signal of the thin film magnetic sensor are electrically connected, and are put into a single package.

* * * * *